(12) United States Patent
Ahn et al.

(10) Patent No.: US 11,617,038 B2
(45) Date of Patent: Mar. 28, 2023

(54) DISPLAY DEVICE AND METHOD OF FABRICATING THE SAME

(71) Applicant: Samsung Display Co., LTD., Yongin-si (KR)

(72) Inventors: Yi Joon Ahn, Seoul (KR); Eun Kyung Yeon, Suwon-si (KR); Jae Been Lee, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 17/533,066

(22) Filed: Nov. 22, 2021

(65) Prior Publication Data

US 2022/0322008 A1 Oct. 6, 2022

(30) Foreign Application Priority Data

Mar. 31, 2021 (KR) .................. 10-2021-0042037

(51) Int. Cl.
*H04R 5/02* (2006.01)
*H05K 5/03* (2006.01)

(52) U.S. Cl.
CPC .............. *H04R 5/02* (2013.01); *H05K 5/03* (2013.01); *H04R 2499/15* (2013.01)

(58) Field of Classification Search
CPC ......... H04R 5/02; H04R 2499/15; H05K 5/03
See application file for complete search history.

(56) References Cited

U.S. PATENT DOCUMENTS

| 2019/0116406 A1 | 4/2019 | Ahn et al. |
| 2020/0379709 A1 | 12/2020 | Kim et al. |
| 2021/0103353 A1* | 4/2021 | Park ................ G06F 1/1694 |

FOREIGN PATENT DOCUMENTS

| KR | 1020170140454 A | 12/2017 |
| KR | 1020190068336 A | 6/2019 |
| KR | 1020190120634 A | 10/2019 |
| KR | 1020210081485 A | 7/2021 |

* cited by examiner

*Primary Examiner* — Andrew L Sniezek
(74) *Attorney, Agent, or Firm* — Cantor Colburn LLP

(57) ABSTRACT

A display device includes a display panel which displays an image, a cover window which is disposed on a first surface of the display panel, and a first sound generator which is disposed on a second surface opposite the first surface of the display panel and outputs sound by vibrating the display panel. The cover window includes a first lattice pattern area including lattice patterns surrounding the first sound generator in a plan view.

17 Claims, 25 Drawing Sheets

DISPLAY DEVICE AND METHOD OF FABRICATING THE SAME

This application claims priority to Korean Patent Application No. 10-2020-0042307, filed on Mar. 31, 2021, and all the benefits accruing therefrom under 35 U.S.C. § 119, the content of which in its entirety is herein incorporated by reference.

BACKGROUND

1. Field

Embodiments of the invention relate to a display device and a method of fabricating the display device.

2. Description of the Related Art

As the information society develops, demands for display devices for displaying images are increasing in various forms. For example, display devices may be implemented as various electronic devices such as smartphones, digital cameras, notebook computers, navigation devices, and smart televisions.

A display device may include a display panel for displaying an image and a sound generator for providing sound. When the sound generator outputs sound by vibrating the display panel, the entire display panel may vibrate. In this case, the sound may be output not only to the front of the display panel but to the side of the display panel.

SUMMARY

Embodiments of the invention provide a display device in which sound output from a side of a display panel is reduced.

Embodiments of the invention provide a method of fabricating a display device in which sound output from the side of a display panel is reduced.

An embodiment of the invention provides a display device which includes a display panel which displays an image, a cover window which is disposed on a first surface of the display panel, and a first sound generator which is disposed on a second surface opposite the first surface of the display panel and outputs sound by vibrating the display panel. In such an embodiment, the cover window includes a first lattice pattern area including lattice patterns surrounding the first sound generator in a plan view.

In an embodiment, each of the lattice patterns may be defined by a hole defined through the cover window and a resin which fills the hole.

In an embodiment, a difference between a refractive index of the cover window and a refractive index of the resin may be about 0.1 or less.

In an embodiment, a first side area of the first lattice pattern area and a second side area of the first lattice pattern area may be connected to each other.

In an embodiment, the lattice patterns may include first lattice patterns which are arranged in a first direction and extend in the first direction, second lattice patterns which are arranged in the first direction and extend in the first direction, and third lattice patterns which are arranged in the first direction and extend in the first direction. In such an embodiment, one second lattice pattern among the second lattice patterns may be disposed between one first lattice pattern among the first lattice patterns and one third lattice pattern among the third lattice patterns in a second direction orthogonal to the first direction.

In an embodiment, a gap between the first lattice patterns adjacent to each other in the first direction is defined as a first gap, a gap between the second lattice patterns adjacent to each other in the first direction may be defined as a second gap, a gap between the third lattice patterns adjacent to each other in the first direction may be defined as a third gap, and the second gap may be disposed between one first lattice pattern and one third lattice pattern, which are adjacent to each other in the second direction.

In an embodiment, the second lattice pattern may be disposed between the first gap and the third gap in the second direction.

In an embodiment, the second lattice pattern may be disposed between a gap between adjacent first lattice patterns and a gap between adjacent third lattice patterns in the second direction.

In an embodiment, the lattice patterns may further include fourth lattice patterns which are arranged in the first direction and extend in the first direction, and the third lattice pattern may be disposed between the second lattice pattern and any one fourth lattice pattern among the fourth lattice patterns in the second direction.

In an embodiment, a gap between the fourth lattice patterns adjacent to each other in the first direction may be defined as a fourth gap, and the third lattice pattern may be disposed between the second gap and the fourth gap in the second direction.

In an embodiment, the third gap may be disposed between the second lattice pattern and the fourth lattice pattern.

In an embodiment, the lattice patterns may further include a first lattice auxiliary pattern disposed in the first gap, and an area of the first lattice pattern may be larger than an area of the first lattice auxiliary pattern.

In an embodiment, The display device may further include a second sound generator which is disposed on the second surface of the display panel and outputs sound by vibrating the display panel. In such an embodiment, the cover window may include a second lattice pattern area surrounding the second sound generator in the plan view.

In an embodiment, an area of a first vibration area defined by the first lattice pattern area may be the same as an area of a second vibration area defined by the second lattice pattern area.

In an embodiment, the first sound generator may output a first stereo sound by vibrating the display panel, and the second sound generator may output a second stereo sound by vibrating the display panel.

In an embodiment, an area of a first vibration area defined by the first lattice pattern area may be smaller than an area of a second vibration area defined by the second lattice pattern area.

In an embodiment, the first sound generator may output a sound in a first frequency band by vibrating the display panel, and the second sound generator may output a sound in a second frequency band by vibrating the display panel.

An embodiment of the invention provides a method of fabricating a display device which includes radiating a laser to a plurality of hole areas of a cover window, forming a plurality of holes through the cover window by etching the cover window using a wet etchant, forming a lattice pattern area including lattice patterns by filling the holes with resin, providing the cover window on a first surface of a display panel, and providing a sound generator on a second surface opposite the first surface of the display panel.

In an embodiment, the lattice pattern area may surround the sound generator in a plan view.

In an embodiment, the method may further include providing a bottom panel cover on the second surface of the display panel after the providing the cover window and before the providing the sound generator. In such an embodiment, the bottom panel cover may not overlap a vibration area defined by the lattice pattern area in a thickness direction of the display panel.

According to embodiments of the display device according to the invention, lattice patterns are provided on the cover window to surround the sound generator in a plan view. Therefore, transmission of the vibration of the sound generator in the cover window to an area other than the vibration area defined may be substantially reduced by the lattice patterns, thereby reducing the amount of sound being output to the side surface of the display panel.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
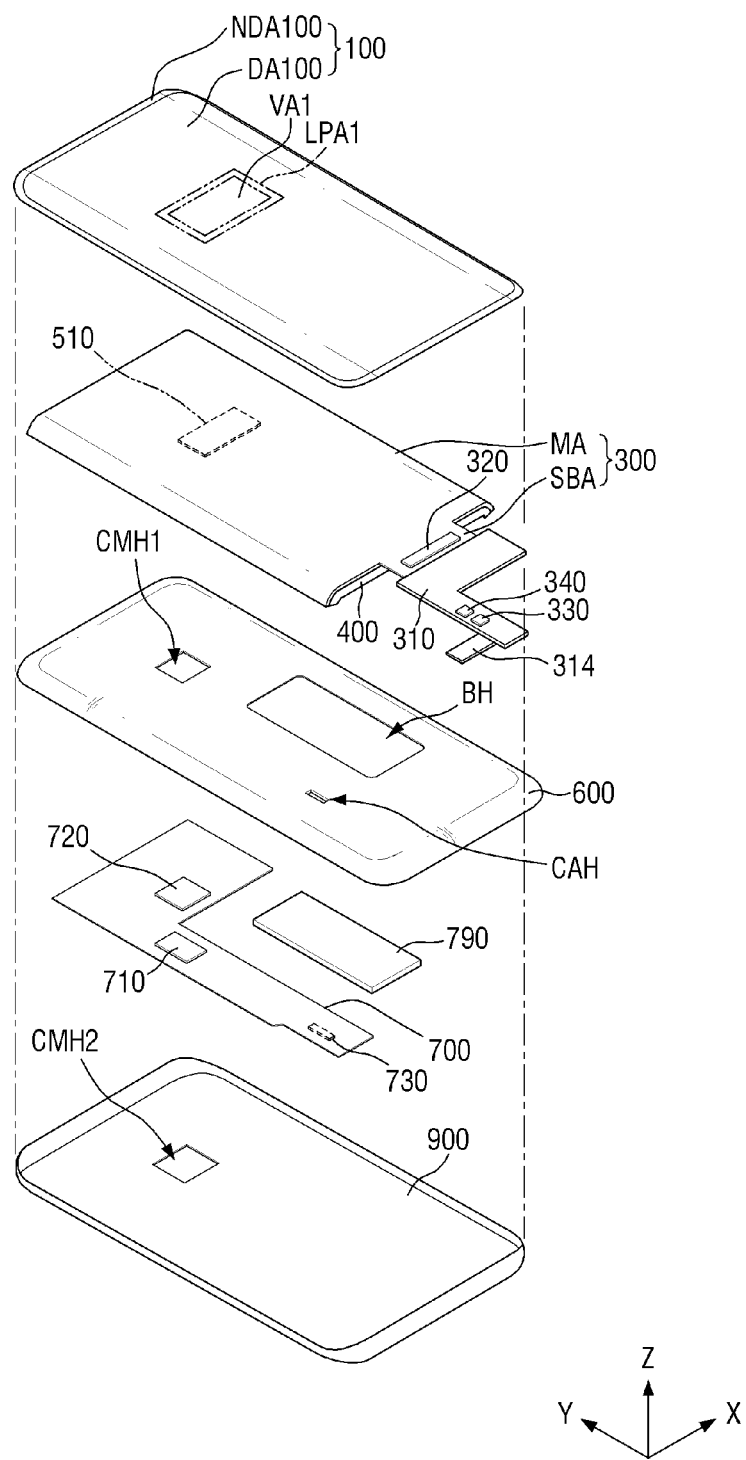
FIG. 1 is an exploded perspective view of a display device according to an embodiment.

Embodiments of the invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is an exploded perspective view of a display device 10 according to an embodiment.

In an embodiment, the display device 10 is a device for displaying moving images or still images. The display device 10 may be used as a display screen in portable electronic devices such as mobile phones, smartphones, tablet personal computers ("PC"s), smart watches, watch phones, mobile communication terminals, electronic notebooks, electronic books, portable multimedia players ("PMP"s), navigation devices and ultra-mobile PCs ("UMPC"s), as well as in various products such as televisions, notebook computers, monitors, billboards and the Internet of things ("IoT"). Alternatively, the display device 10 may be used as a display screen applied to a center fascia of a vehicle. Hereinafter, for convenience of description, embodiments where the display device 10 is a smartphone will be mainly described below, but the disclosure is not limited thereto.

In an embodiment, the display device 10 may be a light emitting display device such as an organic light emitting display device using organic light emitting diodes, a quantum dot light emitting display device including quantum dot light emitting layers, an inorganic light emitting display device including inorganic semiconductors, or a micro light emitting display device using micro light emitting diodes. Hereinafter, for convenience of description, embodiments where the display device 10 is an organic light emitting display device will be mainly described, but the disclosure is not limited to this case.

Referring to FIG. 1, an embodiment of the display device 10 may be a small screen display device such as a smartphone or a tablet. In such an embodiment, the display device 10 includes a cover window 100, a display panel 300, a display circuit board 310, a display driving circuit 320, a bracket 600, a main circuit board 700, and a bottom cover 900.

Herein, a first direction (X-axis direction) may be a direction parallel to short sides of the display device 10 in a plan view, for example, a horizontal direction of the display device 10. A second direction (Y-axis direction) may be a direction parallel to long sides of the display device 10 in a plan view, for example, a vertical direction of the display device 10. A third direction (Z-axis direction) may be a thickness direction of the display device 10. The display device 10 may be rectangular in a plan view. Herein, the term "in a plane view" may mean "when viewed from a plan view in a thickness direction thereof."

The cover window 100 may be disposed on the display panel 300 to cover an upper surface of the display panel 300. The cover window 100 may function to protect the upper surface of the display panel 300. The cover window 100 may include a light transmitting part DA100 which transmits light and a light blocking part NDA100 which blocks light. The light blocking part NDA100 may include a decorative layer including a predetermined pattern.

The cover window 100 may include a first lattice pattern area LPA1 including a plurality of lattice patterns. The first lattice pattern area LPA1 will be described in detail later with reference to FIG. 9.

The display panel 300 may be a light emitting display panel including light emitting elements. In one embodiment, for example, the display panel 300 may be an organic light emitting display panel using organic light emitting diodes including organic light emitting layers, a micro light emitting diode display panel using micro light emitting diodes, a quantum dot light emitting display panel using quantum dot light emitting diodes including quantum dot light emitting layers, or an inorganic light emitting display panel using inorganic light emitting elements including inorganic semiconductors. A case where the display panel 300 is an organic light emitting display panel will be mainly described below.

The display panel 300 may be disposed under the cover window 100. The display panel 300 may be overlapped by the light transmitting part DA100 of the cover window 100.

The display panel 300 may include a substrate SUB, a pixel array layer PAL, and a polarizing film PF. The pixel array layer PAL may include light emitting areas for displaying an image. The polarizing film PF may be disposed on a touch sensing layer TSL to prevent a decrease in visibility due to reflection of external light. The polarizing film PF may include a linear polarizer and a retardation film such as a quarter-wave ($\lambda/4$) plate.

The display panel 300 may include a main area MA and a sub-area SBA. The sub-area SBA may protrude from a side of the main area MA in the second direction (Y-axis direction). Although the sub-area SBA is unfolded in FIG. 1, it may also be bent, in which case the sub-area SBA may be disposed on a lower surface of the display panel 300. When the sub-area SBA is bent, it may be overlapped by the main area MA in the thickness direction (Z-axis direction) of the display panel 300.

The display driving circuit 320 may be disposed in the sub-area SBA of the display panel 300. The display driving circuit 320 receives control signals and power supply voltages through the display circuit board 310 and generates and outputs signals and voltages for driving the display panel 300. The display driving circuit 320 may be formed as an integrated circuit and attached on the display panel 300 using a chip-on glass ("COG") method or a chip-on plastic ("COP") method. However, the disclosure is not limited thereto. In one embodiment, for example, the display driving circuit 320 may be attached on the display circuit board 310.

The display circuit board 310 may be disposed in the sub-area SBA of the display panel 300. An end of the display circuit board 310 may be attached on pads provided in the sub-area SBA of the display panel 300 by using an anisotropic conductive film. The display circuit board 310 may be a flexible printed circuit board that can be bent, a rigid printed circuit board that is rigid and not easily bent, or a composite printed circuit board including both a rigid printed circuit board and a flexible printed circuit board.

The display driving circuit 320 receives control signals and power supply voltages through the display circuit board 310 and generates and outputs signals and voltages for driving the display panel 300. The display driving circuit 320 may be formed as an integrated circuit and attached on the display panel 300 using a COG method, a COP method, or an ultrasonic method. However, the disclosure is not limited thereto. In one embodiment, for example, a touch driving circuit 330 and a sound driving circuit 340 may be disposed on the display circuit board 310.

The touch driving circuit 330 may be formed as an integrated circuit and attached to an upper surface of the display circuit board 310. The touch driving circuit 330 may be electrically connected to touch electrodes of a touch sensor layer of the display panel 300 through the display circuit board 310. The touch driving circuit 330 may transmit touch driving signals to driving electrodes among the touch electrodes and output touch data including a user's touch coordinates by detecting amounts of charge change in capacitances between the driving electrodes and sensing electrodes through the sensing electrodes among the touch electrodes.

The sound driving circuit 340 receives sound data from the main circuit board 700. The sound driving circuit 340 generates sound signals according to the sound data and outputs the sound signals to a first sound generator 510. The sound driving circuit 340 may be formed as an integrated circuit.

A power supply unit for supplying display driving voltages for driving the display driving circuit 320 may be additionally disposed on the display circuit board 310. When the display driving voltages and the sound signals are generated by one circuit, they may be affected by each other. However, the display driving voltages for driving the display panel 300 and the sound signals for driving the first sound generator 510 may be generated by different circuits. Therefore, it is possible to prevent the display driving voltages and the sound signals from being affected by each other.

The first sound generator 510 may be disposed on a surface of the display panel 300. The first sound generator 510 may be attached on the surface of the display panel 300 using a first adhesive member 610 (see FIG. 3) such as a pressure sensitive adhesive.

Figure 5:
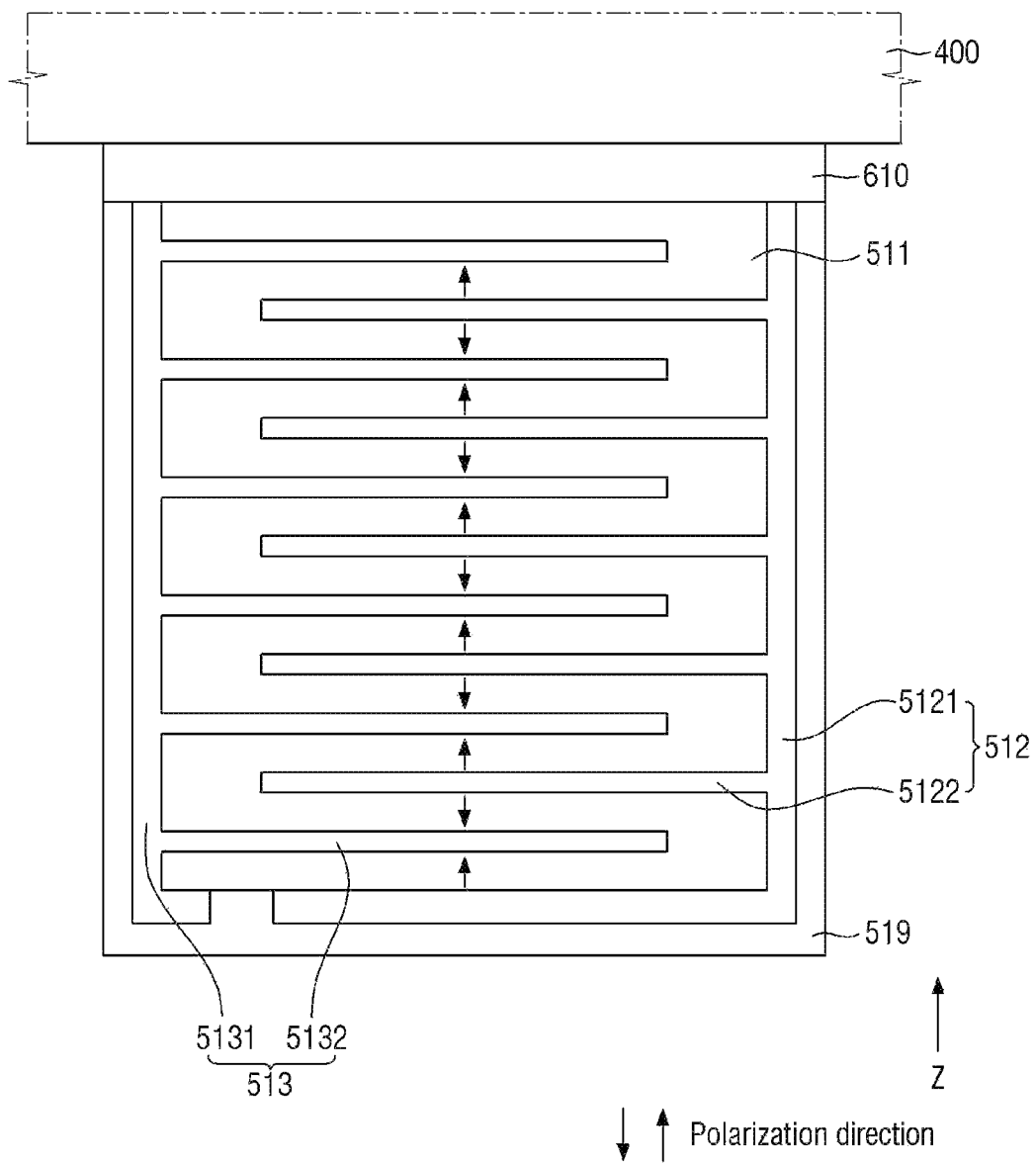
FIG. 5 is a detailed view of a sound generator according to an embodiment.
Figure 6:
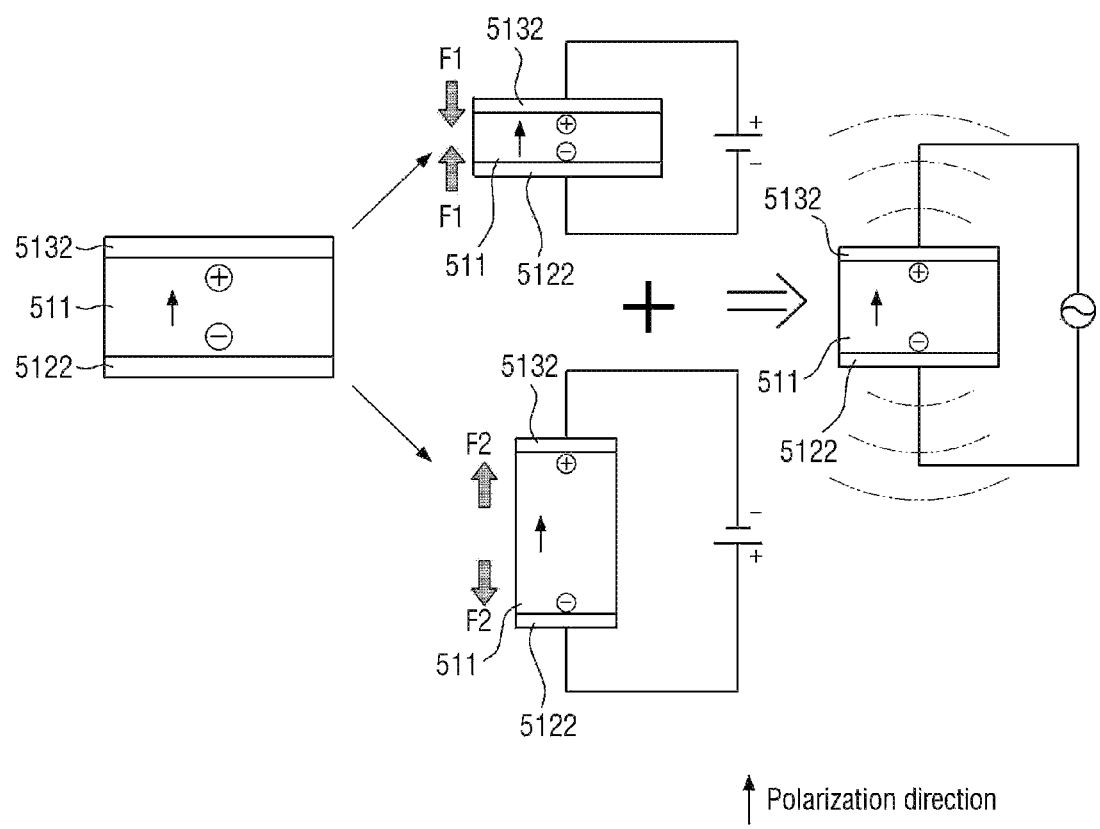
FIG. 6 is a diagram for explaining an inverse piezoelectric effect of the sound generator.
Figure 7:
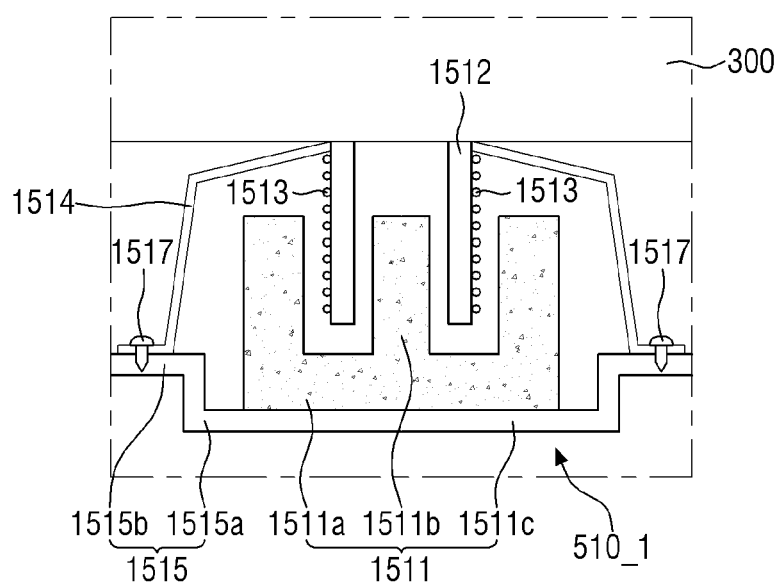
FIG. 7 is a detailed view of a sound generator according to an embodiment.
Figure 8:
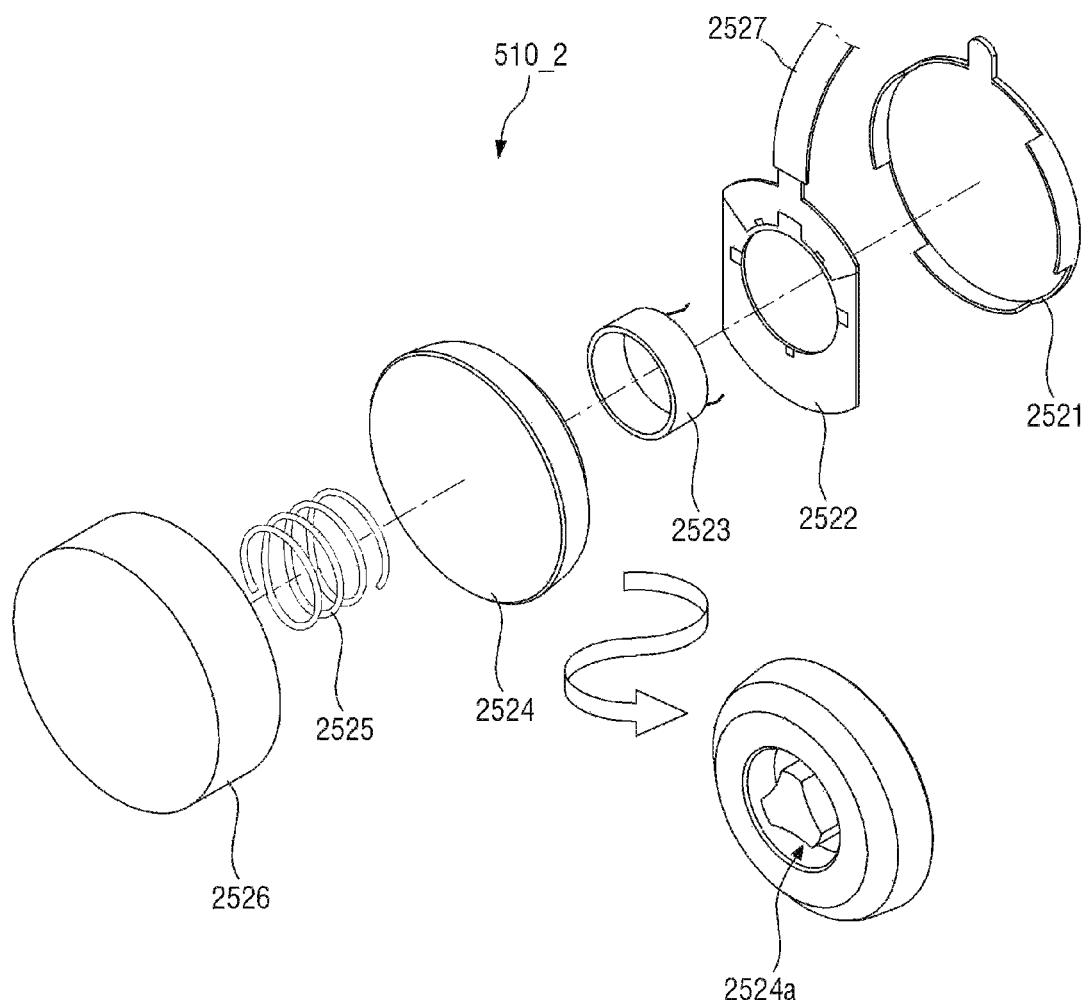
FIG. 8 is a detailed view of a sound generator according to an embodiment.

The first sound generator 510 may be a vibration generator that outputs sound by vibrating the display panel 300. In one embodiment, for example, the first sound generator 510 may be a piezoelectric element or a piezoelectric actuator that vibrates the display panel 300 using a piezoelectric material that contracts or expands according to an applied voltage as illustrated in FIGS. 5 and 6. Alternatively, the first sound generator 510 may be an exciter that vibrates the display panel 300 by generating a magnetic force using a voice coil as illustrated in FIG. 7. Alternatively, the first sound generator 510 may be a linear resonance actuator that vibrates the display panel 300 by generating a magnetic force using a voice coil as illustrated in FIG. 8.

The bracket 600 may be disposed under the display panel 300. The bracket 600 may include plastic, metal, or both plastic and metal. A camera hole CMH1 into which a camera device 720 is inserted, A battery hole BH in which a battery 790 is disposed, and A cable hole CAH through which a cable 314 connected to the display circuit board 310 disposed may be defined in the bracket 600.

The main circuit board 700 and the battery 790 may be disposed under the bracket 600. The main circuit board 700 may be a printed circuit board or a flexible printed circuit board.

The main circuit board 700 may include a main processor 710, the camera device 720, and a main connector 730. The main processor 710 may be formed as an integrated circuit.

The camera device 720 may be disposed on upper and lower surfaces of the main circuit board 700, the main processor 710 may be disposed on the upper surface of the main circuit board 700, and the main connector 730 may be disposed on the lower surface of the main circuit board 700.

The main processor 710 may control an entire function of the display device 10. In one embodiment, for example, the main processor 710 may output digital video data to the display driving circuit 320 through the display circuit board 310 so that the display panel 300 can display an image. In such an embodiment, the main processor 710 may receive touch data from the touch driving circuit 330, determine a user's touch coordinates, and then execute an application indicated by an icon displayed at the user's touch coordinates.

The main processor 710 may receive sound source data from the outside and generate and output sound data corresponding to the sound source data. Alternatively, the main processor 710 may send the sound source data as it is to the sound driving circuit 340 through the display circuit board 310.

The main processor 710 may be an application processor, a central processing unit, or a system chip formed as an integrated circuit.

The camera device 720 processes an image frame such as a still image or a moving image obtained by an image sensor in a camera mode and outputs the processed image frame to the main processor 710.

The cable 314 disposed through the cable hole CAH of the bracket 600 may be connected to the main connector 730. Therefore, the main circuit board 700 may be electrically connected to the display circuit board 310.

In an embodiment, the main circuit board 700 may further include a mobile communication module capable of transmitting or receiving a wireless signal to or from at least one of a base station, an external terminal, and a server over a mobile communication network. The wireless signal may include a voice signal, a video call signal, or various types of data according to transmission/reception of text/multimedia messages.

The battery 790 may be disposed not to overlap the main circuit board 700 in the third direction (Z-axis direction). The battery 790 may overlap the battery hole BH of the bracket 600.

The bottom cover 900 may be disposed under the main circuit board 700 and the battery 790. The bottom cover 900 may be fastened and fixed to the bracket 600. The bottom cover 90 may form or define the bottom exterior of the display device 10. The bottom cover 900 may include plastic, metal, or both plastic and metal.

A second camera hole CMH2 exposing a lower surface of the camera device 720 may be defined in the bottom cover 900. The position of the camera device 720 and the position of the camera hole CMH1 corresponding to the camera device 720 are not limited to the embodiment illustrated in FIG. 1.

Figure 2:
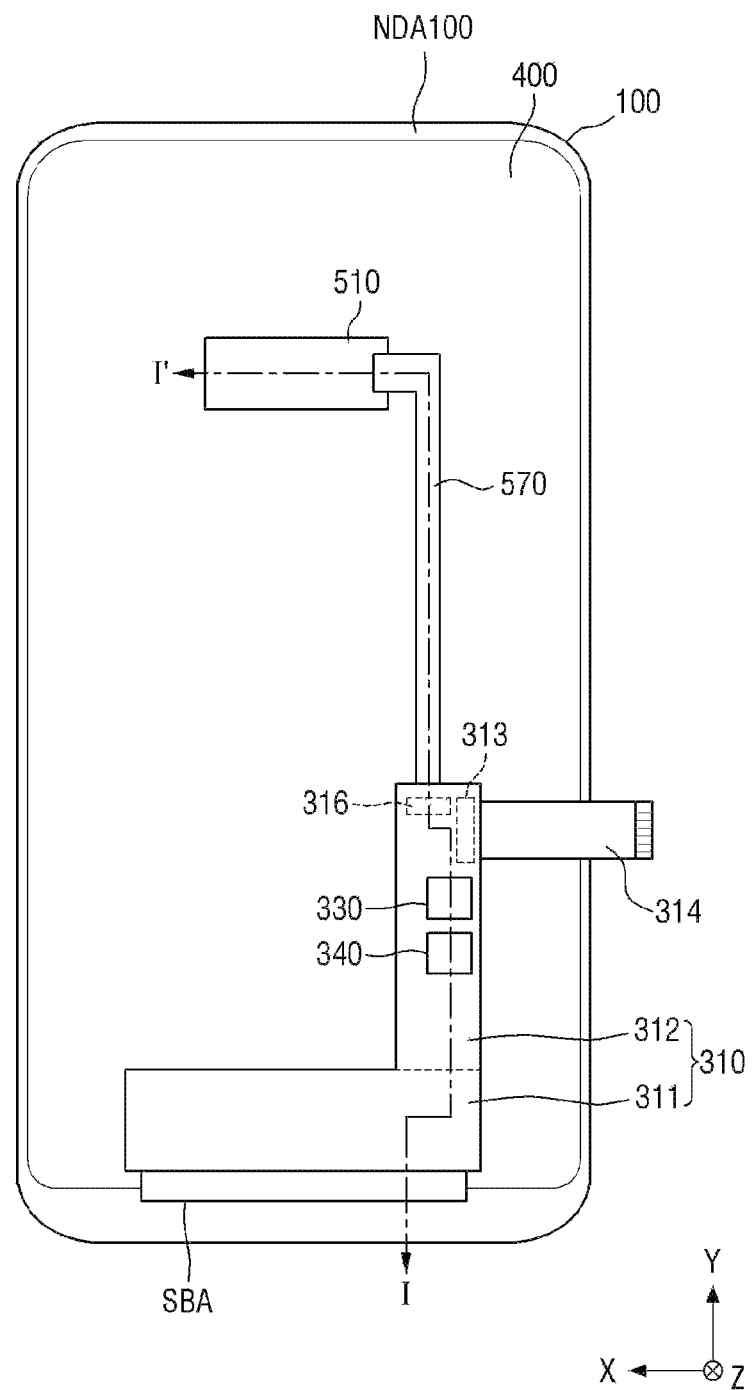
FIG. 2 is a bottom view of a display panel according to an embodiment.
Figure 3:
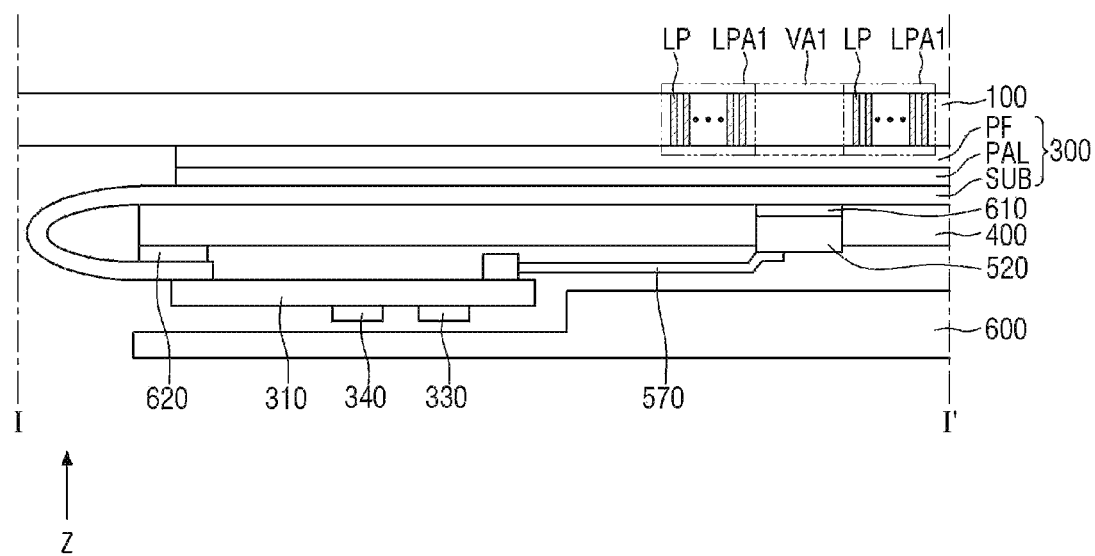
FIG. 3 is a cross-sectional view taken along line I-I' of FIG. 2.

FIG. 2 is a bottom view of a display panel 300 according to an embodiment. FIG. 3 is a cross-sectional view taken along line I-I' of FIG. 2.

Referring to FIGS. 2 and 3, a bottom panel cover 400 may be disposed under the display panel 300. The bottom panel cover 400 may include at least one selected from a light absorbing member 410 (see FIG. 10) for absorbing light incident from the outside, a buffer member 420 (see FIG. 10) for absorbing external impact, and a heat dissipating member 430 (see FIG. 10) for efficiently dissipating the heat of the display panel 300. The bottom panel cover 400 will be described in detail later with reference to FIG. 10.

The sub-area SBA of the display panel 300 may be bent and thus disposed under the bottom panel cover 400 as illustrated in FIGS. 2 and 3. The sub-area SBA of the display panel 300 may be attached to a lower surface of the bottom panel cover 400 by a second adhesive member 620 such as a pressure sensitive adhesive.

The display circuit board 310 attached on the pads of the sub-area SBA of the display panel 300 may be disposed under the bottom panel cover 400. The display circuit board 310 disposed under the bottom panel cover 400 may be fixed or attached to the lower surface of the bottom panel cover 400 by a fixing member such as screws or an adhesive member such as a pressure sensitive adhesive.

The display circuit board 310 may include a first circuit board 311 and a second circuit board 312. Each of the first circuit board 311 and the second circuit board 312 may be a rigid printed circuit board or a flexible printed circuit board. In an embodiment where one of the first circuit board 311 and the second circuit board 312 is a rigid printed circuit board and the other of the first circuit board 311 and the second circuit board 312 is a flexible printed circuit board, the display circuit board 310 may be a composite printed circuit board.

In an embodiment, as shown in FIG. 2, the second circuit board 312 extends from a side of the first circuit board 311 in the second direction (Y-axis direction). A width of the second circuit board 312 in the first direction (X-axis direction) may be smaller than a width of the first circuit board 311 in the first direction (X-axis direction).

The touch driving circuit 330 and the sound driving circuit 340 may be disposed on a surface of the second circuit board 312, and a first connector 313 and a second connector 316 may be disposed on the other surface of the second circuit board 312. The first connector 313 may include an insertion part connected to a first connection terminal provided at an end of the cable 314. The second connector 316 may include an insertion part connected to a connection terminal provided at an end of a flexible circuit board 570.

The first connection terminal provided at the end of the cable 314 may be inserted into the insertion part of the first connector 313. A second connection terminal provided at the other end of the cable 314 may be bent toward the bottom of the main circuit board 700 through the cable hole CAH (see FIG. 1) defined in the bracket 600 and then may be inserted into the main connector 730.

The first sound generator 510 may be disposed on the lower surface of the display panel 300. The first sound generator 510 may be attached to the lower surface of the display panel 300 by the first adhesive member 610 such as a pressure sensitive adhesive. Therefore, when the first sound generator 510 vibrates up and down, the display panel 300 may vibrate in the thickness direction (Z-axis direction).

The connection terminal provided at an end of the flexible circuit board 570 may be inserted into the insertion part of the second connector 316. The other end of the flexible circuit board 570 may be connected to the first sound generator 510. The flexible circuit board 570 may be a flexible printed circuit board or a flexible printed circuit ("FPC").

The battery hole BH, the cable hole CAH, and the camera hole CMH1 may be defined in the bracket 600. The battery hole BH, the cable hole CAH, and the camera hole CMH1 may be holes defined through the bracket 600.

Since the battery hole BH is a hole for accommodating a battery, the battery 790 may overlap the battery hole BH in the third direction (Z-axis direction) of the display panel 300 as illustrated in FIG. 1. The battery hole BH may be larger in size than the battery 790.

Since the camera hole CMH1 of the bracket 600 is a hole for accommodating the camera device 720 of the main circuit board 700, the camera device 720 may overlap the camera hole CMH1 in the third direction (Z-axis direction) of the display panel 300.

According to an embodiment, as illustrated in FIGS. 2 and 3, the first sound generator 510 may be electrically connected to the display circuit board 310 by the flexible circuit board 570. The main circuit board 700 and the display circuit board 310 may be electrically connected to each other by the cable 314.

Figure 4:
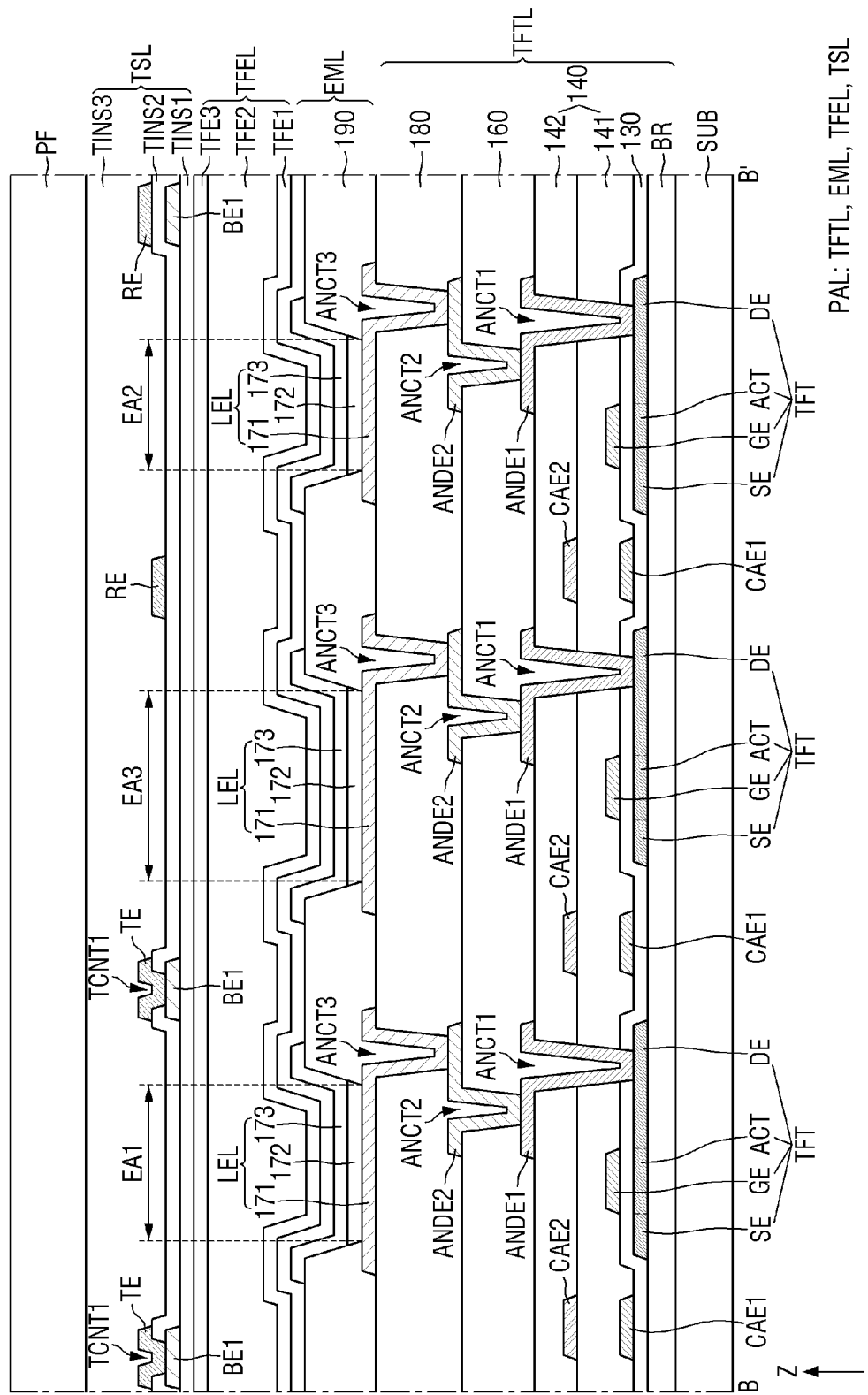
FIG. 4 is a cross-sectional view of an embodiment of the display panel of FIG. 2.

FIG. 4 is a cross-sectional view of an embodiment of the display panel 300 of FIG. 2.

Referring to FIG. 4, an embodiment of the display panel 300 may include the substrate SUB, the pixel array layer PAL, and the polarizing film PF. The pixel array layer PAL may include a thin-film transistor layer TFTL, a light emitting element layer EML, an encapsulation layer TFEL, and the touch sensing layer TSL.

The substrate SUB may be made of an insulating material such as polymer resin. In one embodiment, for example, the substrate SUB may be made of polyimide. The substrate SUB may be a flexible substrate that may be bent, folded, rolled, or the like.

A barrier layer BR may be disposed on the substrate SUB. The barrier layer BR is a layer for protecting transistors of the thin-film transistor layer TFTL and light emitting layers 172 of the light emitting element layer EML from moisture introduced through the substrate SUB which is vulnerable to moisture penetration. The barrier layer BR may include or be defined by a plurality of inorganic layers stacked alternately one on another. In one embodiment, for example, the barrier layer BR may have a multilayer structure in which one or more inorganic layers selected from a silicon nitride layer, a silicon oxynitride layer, a silicon oxide layer, a titanium oxide layer, and an aluminum oxide layer are alternately stacked one on another.

The thin-film transistor layer TFTL including thin-film transistors TFT may be disposed on the barrier layer BR. Each of the thin-film transistors TFT includes an active layer ACT, a gate electrode GE, a source electrode SE, and a drain electrode DE.

The active layer ACT, the source electrode SE, and the drain electrode DE of each of the thin-film transistors TFT may be disposed on the barrier layer BR. The active layer ACT of each of the thin-film transistors TFT includes polycrystalline silicon, monocrystalline silicon, low-temperature polycrystalline silicon, amorphous silicon, or an oxide semiconductor. A portion of the active layer ACT overlapping the gate electrode GE in the third direction (Z-axis direction), which is the thickness direction of the substrate SUB, may be defined as a channel region. The source electrode SE and the drain electrode DE may be portions of the active layer ACT not overlapping the gate electrode GE in the third direction (Z-axis direction) and may be formed to have conductivity by doping a silicon semiconductor or an oxide semiconductor with ions or impurities.

A gate insulating layer 130 may be disposed on the active layers ACT, the source electrodes SE and the drain electrodes DE of the thin-film transistors TFT. The gate insulating layer 130 may include or be made of an inorganic layer such as a silicon nitride layer, a silicon oxynitride layer, a silicon oxide layer, a titanium oxide layer, or an aluminum oxide layer.

The gate electrodes GE of the thin-film transistors TFT and first capacitor electrodes CAE1 may be disposed on the gate insulating layer 130. The gate electrodes GE may overlap the active layers ACT in the third direction (Z-axis direction). Each of the gate electrodes GE and the first capacitor electrodes CAE1 may be a single layer or a multilayer including or made of at least one selected from molybdenum (Mo), aluminum (Al), chromium (Cr), gold (Au), titanium (Ti), nickel (Ni), neodymium (Nd), copper (Cu), and alloys thereof.

A first interlayer insulating film 141 may be disposed on the gate electrodes GE of the thin-film transistors TFT and the first capacitor electrodes CAE1. The first interlayer insulating film 141 may include or be made of an inorganic layer such as a silicon nitride layer, a silicon oxynitride layer, a silicon oxide layer, a titanium oxide layer, or an aluminum oxide layer. The first interlayer insulating film 141 may include or be defined by a plurality of inorganic layers.

Second capacitor electrodes CAE2 may be disposed on the first interlayer insulating film 141. The second capacitor electrodes CAE2 may overlap the first capacitor electrodes CAE1 in the third direction (Z-axis direction). In such an embodiment, the first interlayer insulating film 141 has a predetermined dielectric constant, such that the first capacitor electrodes CAE1, the second capacitor electrodes CAE2, and the first interlayer insulating film 141 disposed between them may form or collectively define capacitors. Each of the second capacitor electrodes CAE2 may be a single layer or a multilayer including or made of any one or more of molybdenum (Mo), aluminum (Al), chromium (Cr), gold (Au), titanium (Ti), nickel (Ni), neodymium (Nd), copper (Cu), and alloys of the same.

A second interlayer insulating film 142 may be disposed on the second capacitor electrodes CAE2. The second interlayer insulating film 142 may include or be made of an inorganic layer such as a silicon nitride layer, a silicon oxynitride layer, a silicon oxide layer, a titanium oxide layer, or an aluminum oxide layer. The second interlayer insulating film 142 may include or be defined by a plurality of inorganic layers.

First anode connection electrodes ANDE1 may be disposed on the second interlayer insulating film 142. The first anode connection electrode ANDE1 may be connected to the drain electrode DE of each of the thin-film transistors TFT through a first connection contact hole ANCT1 defined through the gate insulating layer 130, the first interlayer insulating film 141 and the second interlayer insulating film 142. Each of the first anode connection electrodes ANDE1 may be a single layer or a multilayer including or made of any one or more of molybdenum (Mo), aluminum (Al), chromium (Cr), gold (Au), titanium (Ti), nickel (Ni), neodymium (Nd), copper (Cu), and alloys of the same.

A first planarization layer 160 may be disposed on the first anode connection electrodes ANDE1 to planarize steps due to the thin-film transistors TFT. The first planarization layer 160 may include or be made of an organic layer such as acryl resin, epoxy resin, phenolic resin, polyamide resin, or polyimide resin.

Second anode connection electrodes ANDE2 may be disposed on the first planarization layer 160. Each of the second anode connection electrodes ANDE2 may be connected to a first anode connection electrode ANDE1 through a second connection contact hole ANCT2 defined through the first planarization layer 160. Each of the second anode connection electrodes ANDE2 may be a single layer or a multilayer including or made of any one or more of molybdenum (Mo), aluminum (Al), chromium (Cr), gold (Au), titanium (Ti), nickel (Ni), neodymium (Nd), copper (Cu), and alloys of the same.

A second planarization layer 180 may be disposed on the second anode connection electrodes ANDE2. The second planarization layer 180 may include or be made of an organic layer such as acryl resin, epoxy resin, phenolic resin, polyamide resin, or polyimide resin.

The light emitting element layer EML may be disposed on the second planarization layer 180. The light emitting element layer EML includes light emitting elements LEL and a bank 190. Each of the light emitting elements LEL includes a pixel electrode 171, the light emitting layer 172, and a common electrode 173.

The pixel electrode 171 may be disposed on the second planarization layer 180. The pixel electrode 171 may be connected to each of the second anode connection electrodes ANDE2 through a third connection contact hole ANCT3 defined through the second planarization layer 180.

In a top emission structure in which light is emitted from the light emitting layer 172 toward the common electrode 173, the pixel electrode 171 may include or be made of a metal material having high reflectivity, such as a stacked structure (Ti/Al/Ti) of aluminum and titanium, a stacked structure (ITO/Al/ITO) of aluminum and indium tin oxide ("ITO"), an APC alloy, or a stacked structure (ITO/APC/ITO) of an APC alloy and ITO. The APC alloy is an alloy of silver (Ag), palladium (Pd), and copper (Cu).

The bank 190 may be disposed on the second planarization layer 180 to separate the pixel electrodes 171 to define emission parts EA1 through EA3. The bank 190 may cover edges of the pixel electrodes 171. The bank 190 may include or be made of an organic layer such as acryl resin, epoxy resin, phenolic resin, polyamide resin, or polyimide resin.

Each of the emission parts EA1 through EA3 is an area in which the pixel electrode 171, the light emitting layer 172, and the common electrode 173 are sequentially stacked so that holes from the pixel electrode 171 and electrons from the common electrode 173 combine together in the light emitting layer 172 to emit light. A first emission part EA1 may be an area that emits light of a first color, a second emission part EA2 may be an area that emits light of a second color, and a third emission part EA3 may be an area that emits light of a third color. The first color may be red, the second color may be green, and the third color may be blue, but the disclosure is not limited thereto.

The light emitting layer 172 may be disposed on the pixel electrode 171 and the bank 190. The light emitting layer 172 may include an organic material to emit light of a predetermined color. In one embodiment, for example, the light emitting layer 172 includes a hole transporting layer, an organic material layer, and an electron transporting layer.

The common electrode 173 may be disposed on the light emitting layer 172. The common electrode 173 may cover the light emitting layer 172. The common electrode 173 may be a common layer provided commonly to the respective emission parts EA1 through EA3 of the pixels PX. A capping layer may be disposed on the common electrode 173.

In the top emission structure, the common electrode 173 may include or be made of a transparent conductive material ("TCO") capable of transmitting light, such as ITO or indium zinc oxide ("IZO"), or a semi-transmissive conductive material such as magnesium (Mg), silver (Ag) or an alloy of Mg and Ag. In an embodiment where the common electrode 173 includes or is made of a semi-transmissive conductive material, light output efficiency may be increased by a microcavity.

The encapsulation layer TFEL may be disposed on the common electrodes 173. The encapsulation layer TFEL includes at least one inorganic layer to prevent oxygen or moisture from permeating into the light emitting element layer EML. In an embodiment, the encapsulation layer TFEL includes at least one organic layer to protect the light emitting element layer EML from foreign substances such as dust. In one embodiment, for example, the encapsulation layer TFEL includes a first encapsulating inorganic layer TFE1, an encapsulating organic layer TFE2, and a second encapsulating inorganic layer TFE3.

The first encapsulating inorganic layer TFE1 may be disposed on the common electrodes 173, the encapsulating organic layer TFE2 may be disposed on the first encapsulating inorganic layer TFE1, and the second encapsulating inorganic layer TFE3 may be disposed on the encapsulating organic layer TFE2. Each of the first encapsulating inorganic layer TFE1 and the second encapsulating inorganic layer TFE3 may be a multilayer in which one or more inorganic layers selected from a silicon nitride layer, a silicon oxynitride layer, a silicon oxide layer, a titanium oxide layer, and an aluminum oxide layer are alternately stacked one on another. The encapsulating organic layer TFE2 may be an organic layer such as acryl resin, epoxy resin, phenolic resin, polyamide resin, or polyimide resin.

The touch sensing layer TSL may be disposed on the encapsulation layer TFEL. The touch sensing layer TSL includes a first touch insulating layer TINS1, first connection electrodes BE1, a second touch insulating layer TINS2, driving electrodes TE, sensing electrodes RE, and a third touch insulating layer TINS3.

The first touch insulating layer TINS1 may include or be made of an inorganic layer such as a silicon nitride layer, a silicon oxynitride layer, a silicon oxide layer, a titanium oxide layer, or an aluminum oxide layer.

The first connection electrodes BE1 may be disposed on the first touch insulating layer TINS1. Each of the first connection electrodes BE1 may be a single layer or a multilayer including or made of any one or more of molybdenum (Mo), aluminum (Al), chromium (Cr), gold (Au), titanium (Ti), nickel (Ni), neodymium (Nd), copper (Cu), and alloys of the same.

The second touch insulating layer TINS2 is disposed on the first connection electrodes BE1. The second touch insulating layer TINS2 may include or be made of an inorganic layer such as a silicon nitride layer, a silicon oxynitride layer, a silicon oxide layer, a titanium oxide layer, or an aluminum oxide layer. Alternatively, the second touch insulating layer TINS2 may include or be made of an organic layer such as acryl resin, epoxy resin, phenolic resin, polyamide resin, or polyimide resin.

The driving electrodes TE and the sensing electrodes SE may be disposed on the second touch insulating layer TINS2. Each of the driving electrodes TE and the sensing electrodes RE may be a single layer or a multilayer including or made of any one or more of molybdenum (Mo), aluminum (Al), chromium (Cr), gold (Au), titanium (Ti), nickel (Ni), neodymium (Nd), copper (Cu), and alloys of the same.

The driving electrodes TE and the sensing electrodes RE may overlap the first connection electrodes BE1 in the third direction (Z-axis direction). Each of the driving electrodes TE may be connected to a first connection electrode BE1 through a first touch contact hole TCNT1 defined through the first touch insulating layer TINS1.

The third touch insulating layer TINS3 is disposed on the driving electrodes TE and the sensing electrodes RE. The third touch insulating layer TINS3 may planarize steps formed by the driving electrodes TE, the sensing electrodes RE, and the first connection electrodes BE1. The third touch insulating layer TINS3 may include or be made of an organic layer such as acryl resin, epoxy resin, phenolic resin, polyamide resin, or polyimide resin.

The polarizing film PF may be disposed on the touch sensing layer TSL to prevent a decrease in visibility due to reflection of external light.

FIG. 5 is a detailed view of a sound generator 510 according to an embodiment. FIG. 6 is a diagram for explaining an inverse piezoelectric effect of the sound generator 510.

Referring to FIGS. 5 and 6, as described above, an embodiment of the display device includes a sound generator, e.g., the first found generator 510. In such an embodiment, the first sound generator 510 may be a piezoelectric element or a piezoelectric actuator that vibrates the display panel 300 using a piezoelectric material that contracts or expands in response to an applied voltage. In an embodiment, the first sound generator 510 may include a vibration layer 511, a first electrode 512, and a second electrode 513.

The first electrode 512 may include a first stem electrode 5121 and first branch electrodes 5122. The first stem electrode 5121 may be disposed on at least one side surface of the vibration layer 511 as illustrated in FIG. 5. Alternatively, the first stem electrode 5121 may be disposed through a part of the vibration layer 511. The first stem electrode 5121 may also be disposed on an upper surface of the vibration layer 511. The first branch electrodes 5122 may branch from the first stem electrode 5121. The first branch electrodes 5122 may be arranged parallel to each other.

The second electrode 513 may include a second stem electrode 5131 and second branch electrodes 5132. The second electrode 513 may be spaced apart from the first electrode 512. Therefore, the second electrode 513 may be electrically insulated from the first electrode 512. The second stem electrode 5131 may be disposed on at least one side surface of the vibration layer 511. In an embodiment, the first stem electrode 5121 may be disposed on a first side surface of the vibration layer 511, and the second stem electrode 5131 may be disposed on a second side surface of the vibration layer 511. Alternatively, the second stem electrode 5131 may be disposed through a part of the vibration layer 511. The second stem electrode 5131 may be disposed on the upper surface of the vibration layer 511. The second branch electrodes 5132 may branch from the second stem electrode 5131. The second branch electrodes 5132 may be arranged parallel to each other.

The first branch electrodes 5122 and the second branch electrodes 5132 may be arranged parallel to each other in the horizontal direction (X-axis direction or Y-axis direction). In such an embodiment, the first branch electrodes 5122 and the second branch electrodes 5132 may be alternately arranged in the vertical direction (Z-axis direction). In such an embodiment, the first branch electrodes 5122 and the second branch electrodes 5132 may be repeatedly arranged in the vertical direction (Z-axis direction) in the order of the first branch electrode 5122, the second branch electrode 5132, the first branch electrode 5122, and the second branch electrode 5132.

The first electrode 512 and the second electrode 513 may be connected to pads of the flexible circuit board 570. The pads of the flexible circuit board 570 may be connected to the first electrode 512 and the second electrode 513 exposed on a surface of the first sound generator 510.

The vibration layer 511 may be a piezoelectric element that is deformed based on a driving voltage applied to the first electrode 512 and a driving voltage applied to the second electrode 513. In an embodiment, the vibration layer 511 may include a piezoelectric material, such as a polyvinylidene fluoride ("PVDF") film or plumbum zirconate titanate ("PZT"), and an electroactive polymer.

Since the production temperature of the vibration layer 511 is high, the first electrode 512 and the second electrode 513 may include or be made of silver (Ag) having a high melting point or an alloy of Ag and palladium (Pd). In an embodiment where the first electrode 512 and the second electrode 513 include or are made of an alloy of Ag and Pd, the Ag content may be higher than the Pd content to raise melting points of the first electrode 512 and the second electrode 513.

The vibration layer 511 may be disposed between each pair of the first and second branch electrodes 5122 and 5132. The vibration layer 511 may contract or expand according to a difference between a first driving voltage applied to each first branch electrode 5122 and a second driving voltage applied to a corresponding second branch electrode 5132.

In an embodiment, as illustrated in FIG. 5, when a polarization direction of the vibration layer 511 disposed between a second branch electrode 5132 and a first branch electrode 5122 disposed under the second branch electrode 5132 is an upward direction (↑), the vibration layer 511 may have a positive polarity in an upper area adjacent to the second branch electrode 5132 and a negative polarity in a lower area adjacent to the first branch electrode 5122. In such an embodiment, when the polarization direction of the vibration layer 511 disposed between a first branch electrode 5122 and a second branch electrode 5132 disposed under the first branch electrode 5122 is a downward direction (↓), the vibration layer 511 may have a positive polarity in a lower area adjacent to the second branch electrode 5132 and a negative polarity in an upper area adjacent to the first branch electrode 5122. The polarization direction of the vibration layer 511 may be determined by a poling process in which an electric field is applied to the vibration layer 511 using a first branch electrode 5122 and a second branch electrode 5132.

As illustrated in FIG. 6, in a case where the polarization direction of the vibration layer 511 disposed between a second branch electrode 5132 and a first branch electrode 5122 disposed under the second branch electrode 5132 is the upward direction (↑), when the second driving voltage of positive polarity is applied to the second branch electrode 5132 and the first driving voltage of negative polarity is applied to the first branch electrode 5122, the vibration layer 511 may contract by a first force F1. The first force F1 may be a contractile force. In such a case, when the second driving voltage of the negative polarity is applied to the second branch electrode 5132 and the first driving voltage of the positive polarity is applied to the first branch electrode 5122, the vibration layer 511 may expand by a second force F2. The second force F2 may be a stretching force.

In a case, where the polarization direction of the vibration layer 511 disposed between a first branch electrode 5122 and a second branch electrode 5132 disposed under the first branch electrode 5122 is the downward direction (↓), when the first driving voltage of the positive polarity is applied to the first branch electrode 5122 and the second driving voltage of the negative polarity is applied to the second branch electrode 5132, the vibration layer 511 may expand by a stretching force. In such an case, when the first driving voltage of the negative polarity is applied to the first branch electrode 5122 and the second driving voltage of the positive polarity is applied to the second branch electrode 5132, the vibration layer 511 may contract by a contractile force.

When the first driving voltage applied to the first electrode 512 and the second driving voltage applied to the second electrode 513 repeatedly alternate between the positive polarity and the negative polarity, the vibration layer 511 may repeatedly contract and expand, thus causing the first sound generator 510 to vibrate. Since the first sound generator 510 is disposed on a surface of the display panel 300, when the vibration layer 511 of the first sound generator 510 contracts and expands, the display panel 300 may vibrate in the third direction (Z-axis direction), which is the thickness direction of the display panel 300, due to stress. As the display panel 300 is vibrated by the first sound generator 510, first sound may be output.

A protective layer 519 may be additionally disposed on a lower surface and side surfaces of the first sound generator 510. The protective layer 519 may include or be made of an insulating material or may include or be made of a same material as the vibration layer 511. The protective layer 519 may be disposed on the first electrode 512, the second electrode 513, and the vibration layer 511 exposed without being covered by the first electrode 512 and the second electrode 513. The protective layer 519 may surround the first electrode 512, the second electrode 513, and the vibration layer 511 exposed without being covered by the first electrode 512 and the second electrode 513. Therefore, the vibration layer 511, the first electrode 512 and the second electrode 513 of the first sound generator 510 may be protected by the protective layer 519. Alternatively, the protective layer 519 may be omitted.

FIG. 7 is a detailed view of a sound generator 510_1 according to an embodiment.

Referring to FIG. 7, an embodiment of the sound generator 510_1, e.g., the first sound generator 510 or the second sound generator 520, may be an exciter that vibrates the display panel 300 by generating a magnetic force using a voice coil. The sound generator 510_1 may include a magnet 1511, a bobbin 1512, a voice coil 1513, a damper 1514, a plate 1515, and fixing members 1517.

The magnet 1511 is a permanent magnet, and a sintered magnet such as barium ferrite may be used. The material of the magnet 1511 may be, but is not limited to, ferric trioxide ($Fe_2O_3$), barium carbonate ($BaCO_3$), a neodymium magnet, strontium ferrite with an improved magnetic component, or an aluminum (Al), nickel (Ni) or cobalt (Co) alloy cast magnet. The neodymium magnet may be, for example, neodymium-iron-boron (Nd—Fe—B).

The magnet 1511 may include a flat unit 1511a, a central protrusion 1511b protruding from the center of the flat unit 1511a, and sidewalls 1511c protruding from edges of the flat unit 1511a. The central protrusion 1511b and the sidewalls 1511c may be spaced apart from each other by a predetermined distance. Therefore, a predetermined space may be formed between the central protrusion 1511b and the sidewalls 1511c. in an embodiment, the magnet 1511 may be shaped like a circular cylinder, specifically, a circular cylinder having a circular space formed on any one base of the circular cylinder.

The central protrusion 1511b of the magnet 1511 may have the magnetism of a north (N) pole, and the flat unit 1511a and the sidewalls 1511c may have the magnetism of a south (S) pole. Therefore, an external magnetic field may be formed between the central protrusion 1511b and the flat unit 1511a of the magnet 1511 and between the central protrusion 1511b and the sidewalls 1511c.

The bobbin 1512 may be cylindrical. The central protrusion 1511b of the magnet 1511 may be disposed inside the bobbin 1512. In such an embodiment, the bobbin 1512 may surround the central protrusion 1511b of the magnet 1511. In an embodiment, the sidewalls 1511c of the magnet 1511 may be disposed outside the bobbin 1512. In such an embodiment, the sidewalls 1511c of the magnet 1511 may surround the bobbin 1512. A space may be formed between the bobbin 1512 and the central protrusion 1511b of the magnet 1511 and between the bobbin 1512 and the sidewalls 1511c of the magnet 1511.

The bobbin 1512 may include or be made of a material obtained by processing pulp or paper, aluminum or magnesium or an alloy of the same, a synthetic resin such as polypropylene, or a polyamide-based fiber. An end of the bobbin 1512 may be attached to the display panel 300 using an adhesive member. The adhesive member may be a double-sided tape.

The voice coil 1513 is wound on an outer circumferential surface of the bobbin 1512. An end of the voice coil 1513 may be electrically connected to a first sound wiring WL1, and the other end of the voice coil 1513 may be electrically connected to a second sound wiring WL2. Therefore, the voice coil 1513 may receive a first driving voltage and a second driving voltage from the sound driving circuit 340.

The damper 1514 is disposed between the bobbin 1512 and the plate 1515. A side of the damper 1514 may be fixed to the bobbin 1512, and the other side of the damper 1514 may be fixed to the plate 1515 by the second fixing members 1517 such as screws. Each of the second fixing members 1517 may be inserted and fixed to a damper hole of the damper 1514 and a second fixing hole of the plate 1515. The damper holes of the damper 1514 and the second fixing holes of the plate 1515 may be screw holes to which screws can be fixed. The damper holes of the damper 1514 may be holes defined through the damper 1514, and the second fixing holes of the plate 1515 may be holes defined partially through the plate 1515.

The damper 1514 may have elasticity and may include or be made of a conductive material. The damper 1514 may control the up and down vibration of the bobbin 1512 by contacting or relaxing corresponding to the up and down motion of the bobbin 1512. In such an embodiment, since the damper 1514 is connected to the bobbin 1512 and the plate 1515, the up and down motion of the bobbin 1512 may be limited by a restoring force of the damper 1514. In one embodiment, for example, when the bobbin 1512 vibrates above a predetermined height or vibrates below a predetermined height, the bobbin 1512 may be returned to its original position by the restoring force of the damper 1514.

The plate 1515 may be disposed on a lower surface of the magnet 1511. The plate 1515 may be formed integrally with the magnet 1511 or may be formed separately from the magnet 1511. In an embodiment where the plate 1515 is formed separately from the magnet 1511, the magnet 1511 may be attached to the plate 1515 by an adhesive member such as a double-sided tape. The plate 1515 may be fixed to the bracket 600 by fixing members such as screws.

The plate 1515 may be bent between an area 1515a where the magnet 1511 is disposed and an area 1515b where the fixing members 1517 are disposed. The area 1515a where the magnet 1511 is disposed may be sunken compared with the area 1515b where the fixing members 1517 are disposed. Therefore, a distance between the area 1515a where the magnet 1511 is disposed and the display panel 300 may be greater than a distance between the area 1515b where the fixing members 1517 are disposed and the display panel 300. Accordingly, since a distance between the bracket 600 and the display panel 300 may be minimized even without reducing a height of the sound generator 510_1, a thickness of the display device 10 may be reduced. The height of the sound generator 510_1 refers to a distance from an end of the bobbin 1512 which contacts the display panel 300 to the plate 1515 which contacts the magnet 1511.

An end of the voice coil 1513 may be electrically connected to the sound driving circuit 340 by the first sound wiring WL1 to receive the first driving voltage from the sound driving circuit 340. The other end of the voice coil 1513 may be electrically connected to the sound driving circuit 340 by the second sound wiring WL2 to receive the second driving voltage from the sound driving circuit 340. A current may flow through the voice coil 1513 based on the first driving voltage and the second driving voltage. An applied magnetic field may be formed around the voice coil 1513 based on the current flowing through the voice coil 1513. The direction of the current flowing through the voice coil 1513 when the first driving voltage is a positive voltage and the second driving voltage is a negative voltage is opposite to the direction of the current flowing through the voice coil 1513 when the first driving voltage is a negative voltage and the second driving voltage is a positive voltage. Therefore, the N pole and the S pole of the applied magnetic field formed around the voice coil 1513 may be changed according to the alternating current ("AC") driving of the first driving voltage and the second driving voltage. Accordingly, an attractive force and a repulsive force alternately act on the magnet 1511 and the voice coil 1513, causing the bobbin 1512 on which the voice coil 1513 is wound to reciprocate in the thickness direction (Z-axis direction) of the display panel 300. Therefore, the display panel 300 may vibrate in the thickness direction (Z-axis direction) of the display panel 300 as illustrated in FIG. 7, thereby outputting sound.

FIG. 8 is a detailed view of a sound generator 510_1 according to an embodiment.

Referring to FIG. 8, an embodiment of the sound generator 510_2, e.g., the first sound generator 510 or the second sound generator 520, may be a linear resonance actuator that vibrates the display panel 300 by generating a magnetic force using a voice coil. The sound generator 510_2 may include a lower chassis 2521, a flexible circuit board 2522, a voice coil 2523, a magnet 2524, a spring 2525, and an upper chassis 2526.

The lower chassis 2521 and the upper chassis 2526 may include or be made of a metal material. The flexible circuit board 2522 is disposed on a surface of the lower chassis 2521 which faces the upper chassis 2526 and is connected to a second flexible circuit board 2527. The voice coil 2523 may be connected to a surface of the flexible circuit board 2522 which faces the upper chassis 2526. Therefore, an end of the voice coil 2523 may be electrically connected to one of lead lines of the second flexible circuit board 2527, and the other end of the voice coil 2523 may be connected to another one of the lead lines. The magnet 2524 may be a permanent magnet, and a voice coil groove 2524a for accommodating the voice coil 2523 may be formed in a surface facing the voice coil 2523. An elastic body such as the spring 2525 may be disposed between the magnet 2524 and the upper chassis 2526.

The direction of a current flowing through the voice coil 2523 may be controlled by a first driving voltage applied to an end of the voice coil 2523 and a second driving voltage applied to the other end of the voice coil 2523. An applied magnetic field may be formed around the voice coil 2523 based on the current flowing through the voice coil 2523. In such an embodiment, the direction of the current flowing through the voice coil 2523 when the first driving voltage is a positive voltage and the second driving voltage is a negative voltage is opposite to the direction of the current flowing through the voice coil 2523 when the first driving voltage is a negative voltage and the second driving voltage is a positive voltage. An attractive force and a repulsive force alternately act on the magnet 2524 and the voice coil 2523 based on the AC driving of the first driving voltage and the second driving voltage. Therefore, the magnet 2524 may reciprocate between the voice coil 2523 and the upper chassis 2526 due to the spring 2525.

Vibrations generated by the reciprocating motion of the magnet 2524 may be transmitted to both the lower chassis 2521 and the upper chassis 2526. Therefore, the lower chassis 2521 may be placed to face the bracket 600, and the upper chassis 2526 may be placed to face the display panel 300. Alternatively, the lower chassis 2521 may face the display panel 300, and the upper chassis 2526 may face the bracket 600.

Figure 9:
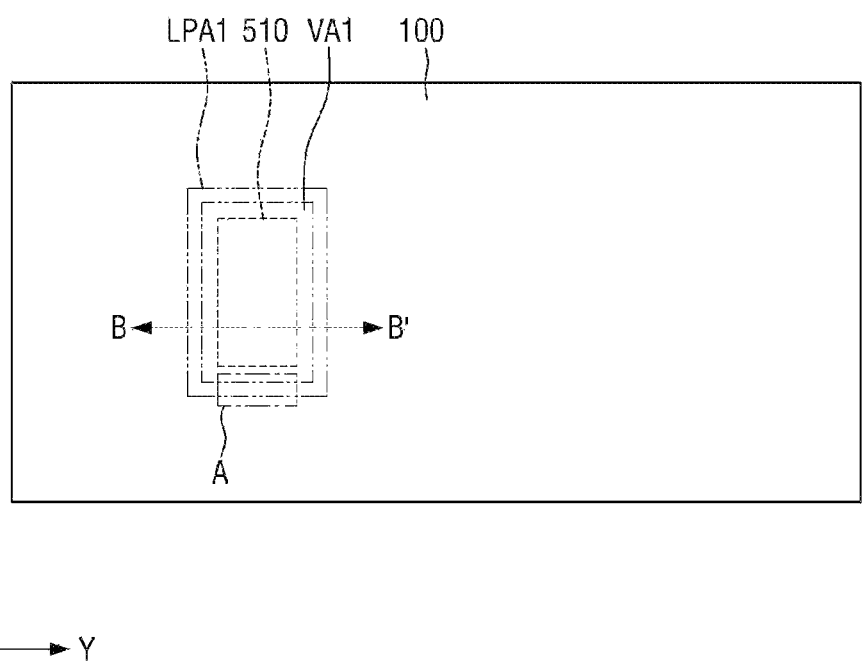
FIG. 9 is a plan view of a cover window and a sound generator according to an embodiment.
Figure 10:
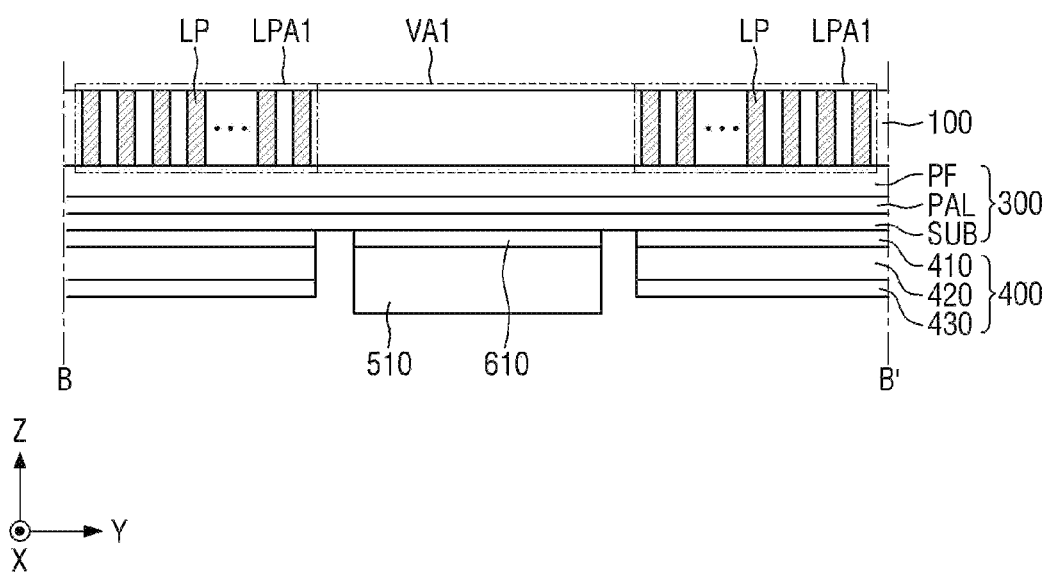
FIG. 10 is a cross-sectional view taken along line B-B' of FIG. 9.

FIG. 9 is a plan view of a cover window 100 and a sound generator 510 according to an embodiment. FIG. 10 is across-sectional view taken along line B-B' of FIG. 9. In FIG. 9, since the first sound generator 510 is disposed on a lower surface of the cover window 100, the first sound generator 510 is indicated by a dotted line.

Referring to FIGS. 9 and 10, the cover window 100 includes a first lattice pattern area LPA1 in which a plurality of lattice patterns LP are disposed. The first lattice pattern area LPA1 may define a first vibration area VA1. The first vibration area VA1 may be an area surrounded by the first lattice pattern area LPA1. The first vibration area VA1 may overlap the first sound generator 510 in the third direction (Z-axis direction).

The bottom panel cover 400 may include at least one selected from the light absorbing member 410 for absorbing light incident from the outside, the buffer member 420 for absorbing external impact, and the heat dissipating member 430 for efficiently dissipating the heat of the display panel 300.

The light absorbing member 410 may be disposed under the display panel 300. The light absorbing member 410 blocks transmission of light to prevent elements disposed under the light absorbing member 410, for example, the display circuit board 310, etc. from being seen from above the display panel 300. The light absorbing member 410 may include a light absorbing material such as a black pigment or dye.

The buffer member 420 may be disposed under the light absorbing member 410. The buffer member 420 absorbs external impact to prevent the display panel 300 from being damaged. The buffer member 420 may include or be defined by a single layer or a plurality of layers. In one embodiment, for example, the buffer member 420 may include or be made of polymer resin such as polyurethane, polycarbonate, polypropylene or polyethylene or may include or be made of an elastic material such as sponge formed by foaming rubber, a urethane-based material or an acrylic-based material. The buffer member 420 may be a cushion layer.

The heat dissipating member 430 may be disposed under the buffer member 420. The heat dissipating member 430 may include a first heat dissipating layer including graphite or carbon nanotubes and a second heat dissipating layer including or defined by a metal thin film (such as copper, nickel, ferrite or silver) capable of shielding electromagnetic waves and having high thermal conductivity.

The first sound generator 510 may not overlap the bottom panel cover 400 in the third direction (Z-axis direction). Therefore, the bottom panel cover 400 may not overlap the first vibration area VA1 in the third direction (Z-axis direction). If the first sound generator 510 is attached to the bottom panel cover 400, the vibration of the first sound generator 510 may be absorbed by the buffer member 420. Therefore, it may be difficult to vibrate the display panel 300 through the first sound generator 510.

The first sound generator 510 may be attached to a surface of the display panel 300 by the first adhesive member 610. In an embodiment, the first adhesive member 610 may include a light absorbing material such as a black pigment or dye to prevent the first sound generator 510 from being seen.

In such an embodiment, since the first lattice pattern area LPA1 includes the lattice patterns LP, the cover window 100 may have flexibility in the first lattice pattern area LPA1. In such an embodiment, a modulus of the first vibration area VA1 in the cover window 100 may be lower than a modulus of an area other than the first vibration area VA1. The modulus is a modulus of elasticity representing the ratio of stress to strain, and the lower the modulus, the higher the elasticity. Therefore, in the cover window 100, the degree of vibration freedom of the first vibration area VA1 may be higher than the degree of vibration freedom of the area other than the first vibration area VA1. In such an embodiment, when the vibration of the first sound generator 510 occurs in the first vibration area VA1, the first lattice pattern area LPA1 including the lattice patterns LP may reduce the vibration of the first sound generator 510 from being transmitted to the area other than the first vibration area VA1 in the cover window 100. Accordingly, in such an embodiment, the sound output by the first sound generator 510 from the side of the display device 10 instead of the front of the display device 10 may be substantially reduced.

Figure 11:
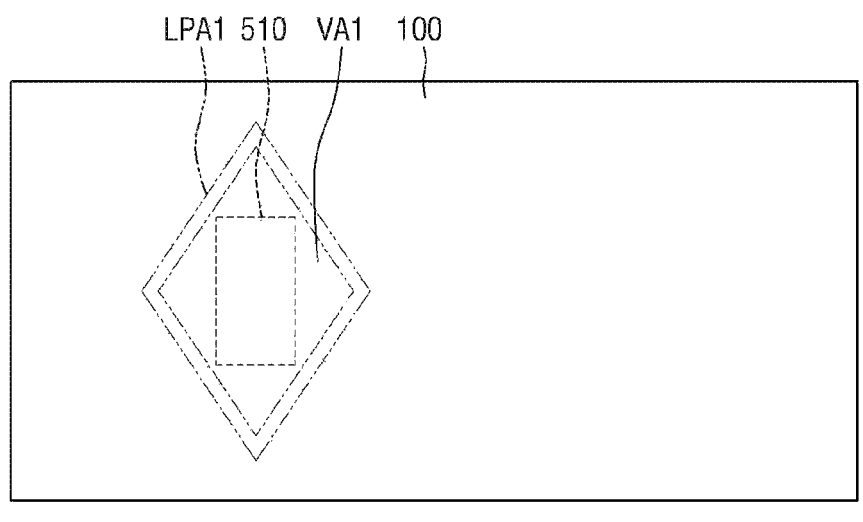
FIG. 11 is a plan view of a cover window and a sound generator according to an embodiment.
Figure 12:
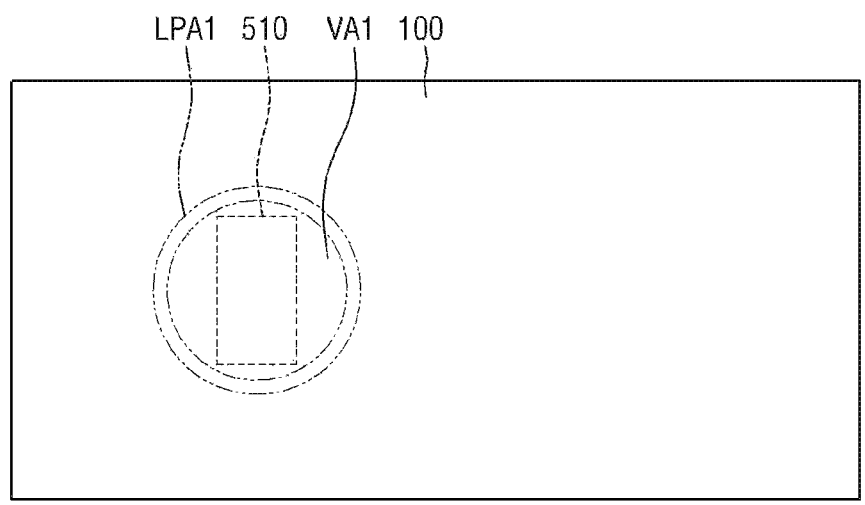
FIG. 12 is a plan view of a cover window and a sound generator according to an embodiment.

In an embodiment, as shown in FIG. 9, the first lattice pattern area LPA1 is shaped in a rectangular frame-like shape (or a rectangular window frame) in a plan view, and the first vibration area VA1 is rectangular in a plan view. However, embodiments of the disclosure are not limited thereto. In one embodiment, for example, as illustrated in FIG. 11, the first lattice pattern area LPA1 may be shaped in a quadrangular (e.g., rhombus) frame-like shape (or a quadrangular window frame-like shape) in a plan view, and the first vibration area VA1 may be quadrangular (e.g., rhombic) in a plan view. Alternatively, as illustrated in FIG. 12, the first lattice pattern area LPA1 may be shaped in a circular frame-like shape (or a circular window frame) in a plan view, and the first vibration area VA1 may be circular in a plan view. Alternatively, although not illustrated in FIGS. 9, 11 and 12, the first lattice pattern area LPA1 may be shaped in an elliptical frame-like shape, a polygonal frame-like shape or an irregular-shaped frame-like shape in a plan view, and the first vibration area VA1 may be elliptical, polygonal or irregular-shaped in a plan view.

In an embodiment, the first sound generator 510 may be quadrangular in a plan view, as shown in FIGS. 9, 11 and 12. However, embodiments of the disclosure are not limited thereto. In one embodiment, for example, the first sound generator 510 may be polygonal, circular, elliptical, or irregular-shaped in a plan view.

FIGS. 13A through 13D are enlarged plan views illustrating embodiments of the lattice pattern area LPA1. Particularly, FIGS. 13A through 13D correspond to an enlarged view of the portion A of FIG. 9.

Referring to FIGS. 13A through 13D, the first lattice pattern area LPA1 includes a plurality of lattice patterns LP. The lattice patterns LP may include first lattice patterns LP1, second lattice patterns LP2, third lattice patterns LP3, and fourth lattice patterns LP4.

The first lattice patterns LP1, the second lattice patterns LP2, the third lattice patterns LP3, and the fourth lattice patterns LP4 may each extend in one direction DR1. The first lattice patterns LP1, the second lattice patterns LP2, the third lattice patterns LP3, and the fourth lattice patterns LP4 may be repeatedly disposed in the other direction DR2. The one direction DR1 may be substantially the same as one of the first direction (X-axis direction) and the second direction (Y-axis direction), and the other direction DR2 may be substantially the same as the other of the first direction DR1 (X-axis direction) and the second direction (Y-axis direction).

The first lattice patterns LP1 may be arranged in the one direction DR1. The first lattice patterns LP1 adjacent to each other in the one direction DR1 may be spaced apart from each other by a first gap GP1.

The second lattice patterns LP2 may be arranged in the one direction DR1. The second lattice patterns LP2 adjacent to each other in the one direction DR1 may be spaced apart from each other by a second gap GP2.

The third lattice patterns LP3 may be arranged in the one direction DR1 The third lattice patterns LP3 adjacent to each other in the one direction DR1 may be spaced apart from each other by a third gap GP3.

The fourth lattice patterns LP4 may be arranged in the one direction DR1. The fourth lattice patterns LP4 adjacent to each other in the one direction DR1 may be spaced apart from each other by a fourth gap GP4.

One first lattice pattern LP1 among the first lattice patterns LP1, one second lattice pattern LP2 among the second lattice patterns LP2, one third lattice pattern LP3 among the third lattice patterns LP3, and one fourth lattice pattern LP4 among the fourth lattice patterns LP4 may be sequentially disposed in the other direction DR2 intersecting the one direction DR1.

In an embodiment, the second lattice pattern LP2 and the fourth lattice pattern LP4 may be shifted in the one direction DR1 compared with the first lattice pattern LP1 and the third lattice pattern LP3. Therefore, the second lattice pattern LP2 may be disposed between the first gap GP1 and the third gap GP3 in the other direction DR2. In addition, the third lattice pattern LP3 may be disposed between the second gap GP2 and the fourth gap GP4 in the other direction DR2. In addition, the second gap GP2 may be disposed between the first lattice pattern LP1 and the third lattice pattern LP3 in the other direction DR2. In addition, the third gap GP3 may be disposed between the second lattice pattern LP2 and the fourth lattice pattern LP4 in the other direction DR2. Therefore, although a first side area of the first lattice pattern area LPA1 and a second side area of the first lattice pattern area LPA1 are connected to each other without being separated, the first lattice pattern area LPA1 may have flexibility due to the lattice patterns LP. The area inside the first lattice pattern area LPA1 may be the first vibration area VA1.

Each of the first lattice patterns LP1 may include a hole HL defined through the cover window 100 and a resin RS filling the hole HL. Each of the second lattice patterns LP2, the third lattice patterns LP3, and the fourth lattice patterns LP4 may also include a hole HL defined through the cover window 100 and a resin RS filling the hole HL. The resin RS may be a polymer. In an embodiment, a difference between a refractive index of the cover window 100 and a refractive index of the resin RS may be about 0.1 or less such that the refraction of light at a boundary between the cover window 100 and the resin RS may be minimized. In an embodiment, the refractive index of the cover window 100 and the refractive index of the resin RS may be substantially equal to each other such that the refraction of light at the boundary between the cover window 100 and the resin RS may be effectively prevented.

Figure 13A:
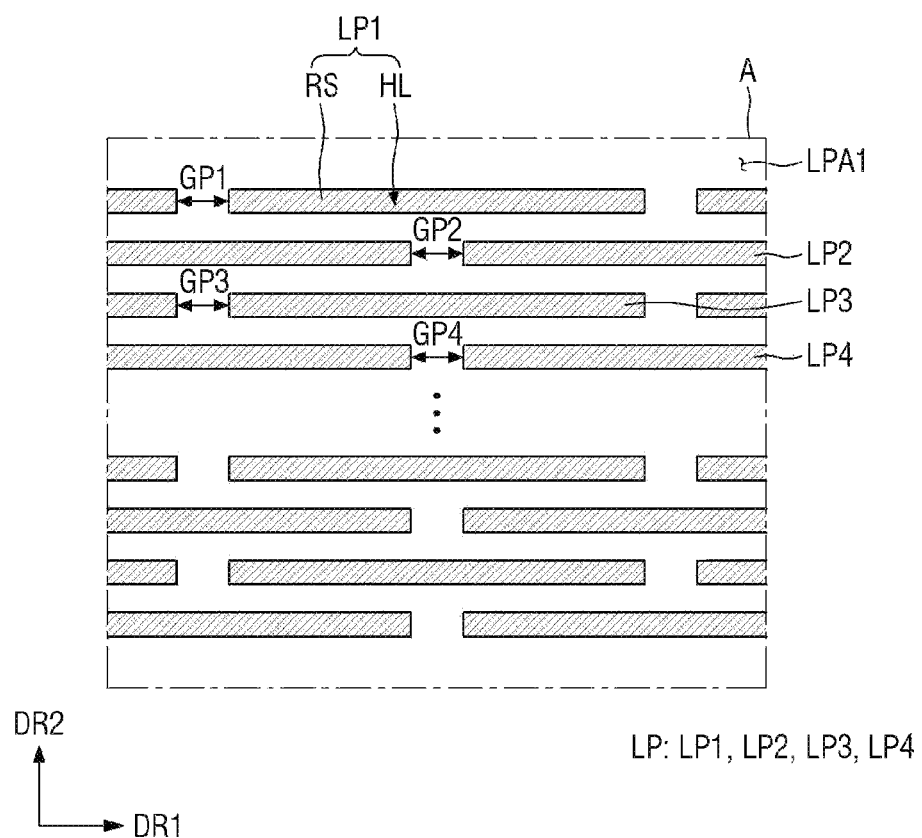
FIGS. 13A through 13D are enlarged plan views illustrating embodiments of lattice patterns.
Figure 13B:
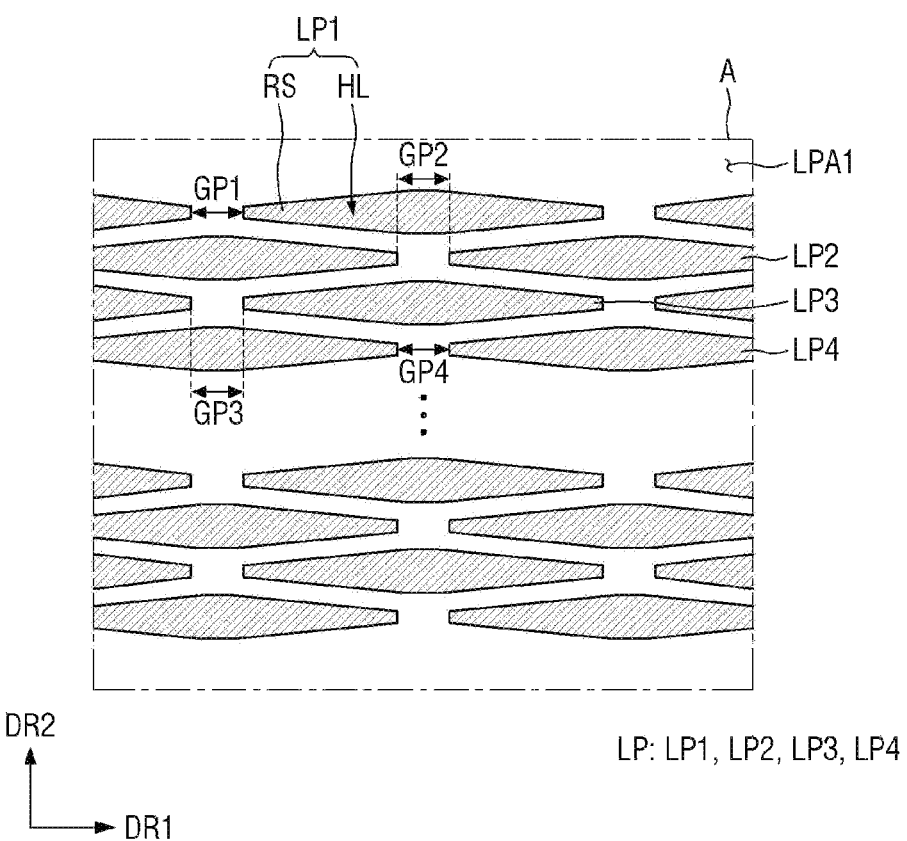
Figure 13C:
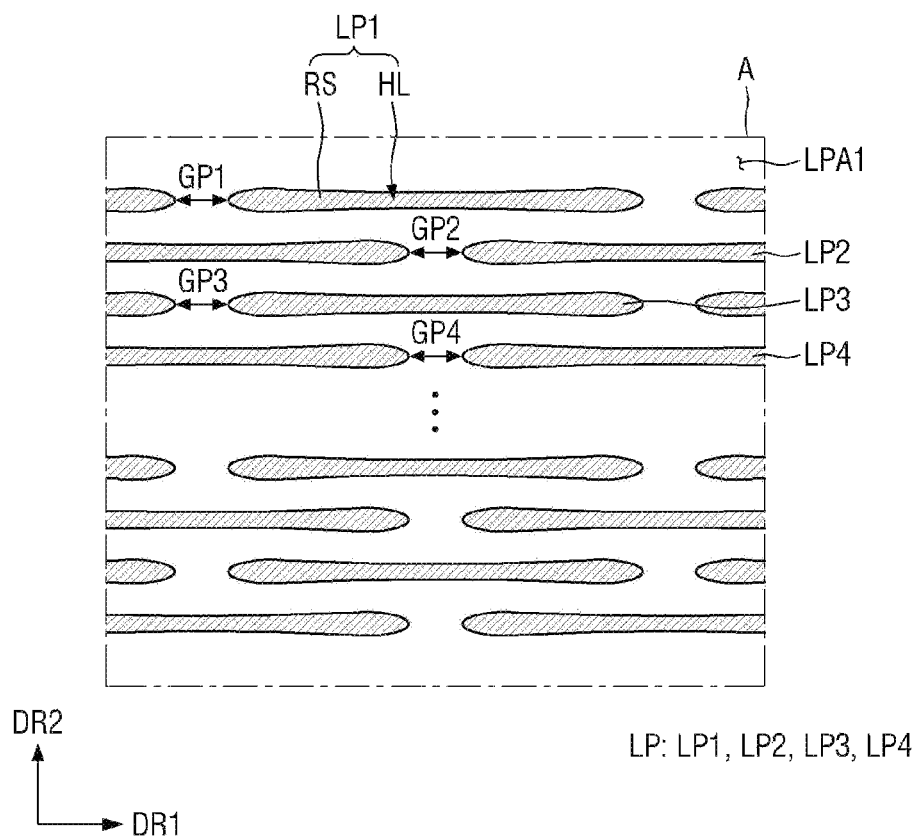

Each of the lattice patterns LP may have a quadrangular planar shape as illustrated in FIG. 13A or an octagonal planar shape as illustrated in FIG. 13B. Alternatively, each of the lattice patterns LP may be shaped in a club-like shape having sides thicker than the middle in a plan view as illustrated in FIG. 13C.

Figure 13D:
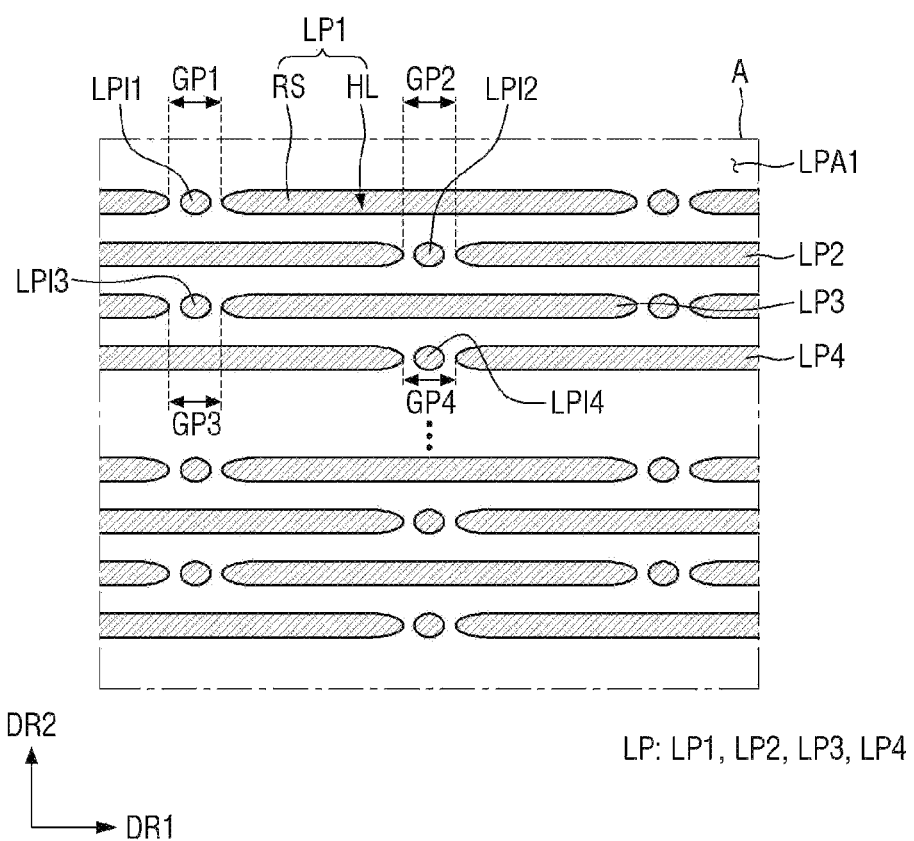

Alternatively, as illustrated in FIG. 13D, a first lattice auxiliary pattern LPI1 may be disposed between the first lattice patterns LP1 adjacent to each other in the one direction DR1, and a second lattice auxiliary pattern LPI2 may be disposed between the second lattice patterns LP2 adjacent to each other in the one direction DR1. In such an embodiment, the first lattice auxiliary pattern LPI1 may be disposed in the first gap GP1, and the second lattice auxiliary pattern LPI2 may be disposed in the second gap GP2. The area of the first lattice auxiliary pattern LPI1 may be smaller than the area of each of the first lattice patterns LP1, and the area of the second lattice auxiliary pattern LPI2 may be smaller than the area of each of the second lattice patterns LP2.

In such an embodiment, a third lattice auxiliary pattern LPI3 may be disposed between the third lattice patterns LP3 adjacent to each other in the one direction DR1, and a fourth lattice auxiliary pattern LPI4 may be disposed between the fourth lattice patterns LP4 adjacent to each other in the one direction DR1. In such an embodiment, the third lattice auxiliary pattern LPI3 may be disposed in the third gap GP3, and the fourth lattice auxiliary pattern LPI4 may be disposed in the fourth gap GP4. The area of the third lattice auxiliary pattern LPI3 may be smaller than the area of each of the third lattice patterns LP3, and the area of the fourth lattice auxiliary pattern LPI4 may be smaller than the area of each of the fourth lattice patterns LP4.

In an embodiment, as shown in FIG. 13D, each of the first lattice auxiliary pattern LPI1, the second lattice auxiliary pattern LPI2, the third lattice auxiliary pattern LPI3, and the fourth lattice auxiliary pattern LPI4 is circular in a plan view, but embodiments of the disclosure are not limited thereto. Each of the first lattice auxiliary pattern LPI1, the second lattice auxiliary pattern LPI2, the third lattice auxiliary pattern LPI3, and the fourth lattice auxiliary pattern LPI4 may also be polygonal, elliptical, or irregular-shaped in a plan view.

Like the first lattice patterns LP1, each of the first lattice auxiliary pattern LPI1, the second lattice auxiliary pattern LPI2, the third lattice auxiliary pattern LPI3, and the fourth lattice auxiliary pattern LPI4 may include a hole defined through the cover window 100 and a resin filling the hole. Due to the first lattice auxiliary pattern LPI1, the second lattice auxiliary pattern LPI2, the third lattice auxiliary pattern LPI3, and the fourth lattice auxiliary pattern LPI4, the flexibility of the first lattice pattern area LPA1 may be further increased.

Figure 14:
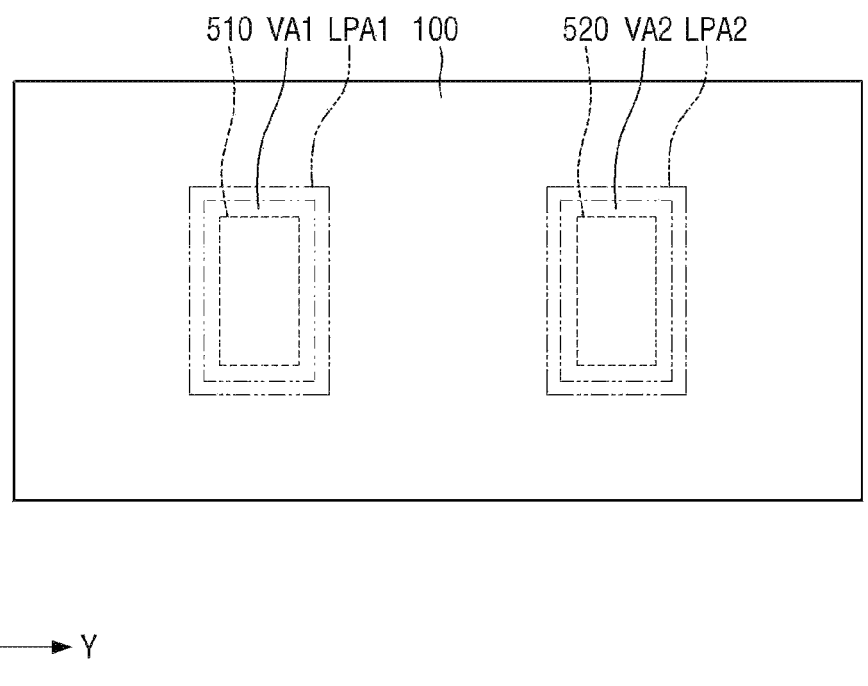
FIG. 14 is a plan view of a cover window and a plurality of sound generators according to an embodiment.

FIG. 14 is a plan view of a cover window 100 and a plurality of sound generators 510 and 520 according to an embodiment.

The embodiment of FIG. 14 is substantially the same as the embodiment of FIG. 9 except that the display device 10 additionally includes a second sound generator 520, and the cover window 100 includes a second lattice pattern area LPA2 surrounding the second sound generator 520. The same or like elements shown in FIG. 14 have been labeled with the same reference characters as used above to describe the embodiment shown in FIG. 9, and any repetitive detailed description thereof will hereinafter be omitted or simplified.

Referring to FIG. 14, in an embodiment, the cover window 100 may include the second lattice pattern area LPA2 in which another plurality of lattice patterns LP is disposed. The second lattice pattern area LPA2 may define a second vibration area VA2. The second vibration area VA2 may be an area surrounded by the second lattice pattern area LPA2. A first vibration area VA1 may be disposed adjacent to an upper side of the display panel 300, and the second vibration area VA2 may be disposed adjacent to a lower side of the display panel 300.

The second vibration area VA2 may overlap the second sound generator 520 in the third direction (Z-axis direction). The second sound generator 520 may not overlap the bottom panel cover 400 in the third direction (Z-axis direction). Therefore, the bottom panel cover 400 may not overlap the second vibration area VA2 in the third direction (Z-axis direction). If the second sound generator 520 is attached to the bottom panel cover 400, the vibration of the second sound generator 520 may be absorbed by the buffer member 420. Therefore, it may be difficult to vibrate the display panel 300 through the second sound generator 520.

The second sound generator 520 may be attached to a surface of the display panel 300 by an adhesive member. In one embodiment, for example, the second sound generator 520 may be attached to a surface of the substrate SUB by an adhesive member. In an embodiment, the adhesive member may include a light absorbing material such as a black pigment or dye to prevent the second sound generator 520 from being seen.

In such an embodiment, since the second lattice pattern area LPA2 includes the lattice patterns LP, the cover window 100 may have flexibility in the second lattice pattern area LPA2. In such an embodiment, a modulus of the second vibration area VA2 in the cover window 100 may be lower than a modulus of an area other than the vibration areas VA1 and VA2. The modulus is a modulus of elasticity representing the ratio of stress to strain, and the lower the modulus, the higher the elasticity. Therefore, in the cover window 100, the degree of vibration freedom of the second vibration area VA2 may be higher than the degree of vibration freedom of the area other than the vibration areas VA1 and VA2. Hence, when the vibration of the second sound generator 520 occurs in the second vibration area VA2, the second lattice pattern area LPA2 including the lattice patterns LP may reduce the vibration of the second sound generator 520 from being transmitted to the area other than the second vibration area VA2 in the cover window 100. Accordingly, the sound output by the second sound generator 520 from the side of the display device 10 instead of the front of the display device 10 may be substantially reduced.

In FIG. 14, the second lattice pattern area LPA2 is shaped in a rectangular frame-like shape (or a rectangular window frame-like shape) in a plan view, and the second vibration area VA2 is rectangular in a plan view. However, embodiments of the disclosure are not limited thereto. In one embodiment, for example, the second lattice pattern area LPA2 may be shaped like a polygonal frame-like shape, a circular frame-like shape, an elliptical frame-like shape or an irregular-shaped frame-like shape in a plan view, and the second vibration area VA2 may be polygonal, circular, elliptical or irregular-shaped in a plan view.

In an embodiment, the second sound generator 520 is quadrangular in a plan view, as shown in FIG. 14. However, embodiments of the disclosure are not limited thereto. In one embodiment, for example, the second sound generator 520 may be polygonal, circular, elliptical, or irregular-shaped in a plan view.

In an embodiment, the area of the first vibration area VA1 may be substantially the same as the area of the second vibration area VA2. In such an embodiment, a first sound output when the first sound generator 510 vibrates the first vibration area VA1 may be a first stereo sound, and a second sound output when the second sound generator 520 vibrates the second vibration area VA2 may be a second stereo sound. Therefore, the display device 10 may output the first stereo sound and the second stereo sound, that is, a 2-channel sound.

In an embodiment, the first sound generator 510 and the second sound generator 520 may be a same type of vibration generator. In one embodiment, for example, both the first sound generator 510 and the second sound generator 520 may be piezoelectric elements, piezoelectric actuators, exciters, or linear resonance actuators.

Figure 15:
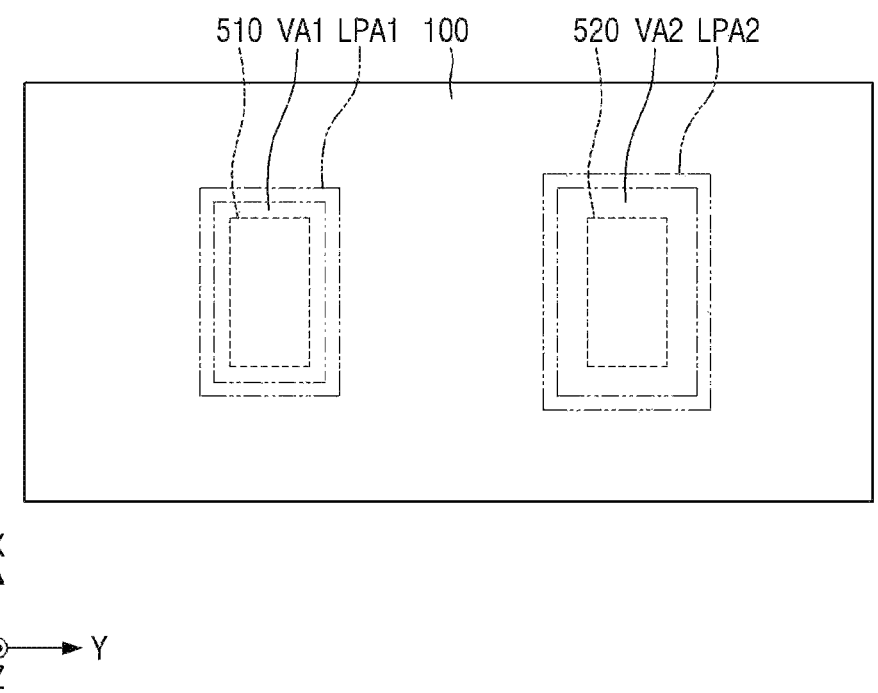
FIG. 15 is a plan view of a cover window and a plurality of sound generators according to an embodiment.

FIG. 15 is a plan view of a cover window 100 and a plurality of sound generators 510 and 520 according to an embodiment.

The embodiment of FIG. 15 is substantially the same as the embodiment of FIG. 14 except that the area of a second vibration area VA2 is larger than the area of a first vibration area VA1. The same or like elements shown in FIG. 15 have been labeled with the same reference characters as used above to describe the embodiment shown in FIG. 14, and any repetitive detailed description thereof will hereinafter be omitted or simplified.

Referring to FIG. 15, since a larger vibration area is more desired in implementing a bass sound, a first sound output when a first sound generator 510 vibrates the first vibration area VA1 may be a sound in a first frequency band, and a second sound output when a second sound generator 520 vibrates the second vibration area VA2 may be a sound in a second frequency band. The second frequency band may be lower than the first frequency band. In one embodiment, for example, the first frequency band may be a frequency band having a maximum sound pressure level (measured in decibels (dB)) of about 800 hertz (Hz) or higher, and the second frequency band may be a frequency band having a maximum sound pressure level lower than about 800 Hz. Therefore, since the display device 10 may output both a low-pitched sound and a high-pitched sound, a rich sound may be provided to a user.

In an embodiment, the first sound generator 510 and the second sound generator 520 may be different types of vibration generators. In one embodiment, for example, the first sound generator 510 may be a piezoelectric element, a piezoelectric actuator or an exciter, which is desired in outputting a high-pitched sound, and the second sound generator 520 may be an exciter or a linear resonance actuator, which is desired in outputting a low-pitched sound.

Figure 16:
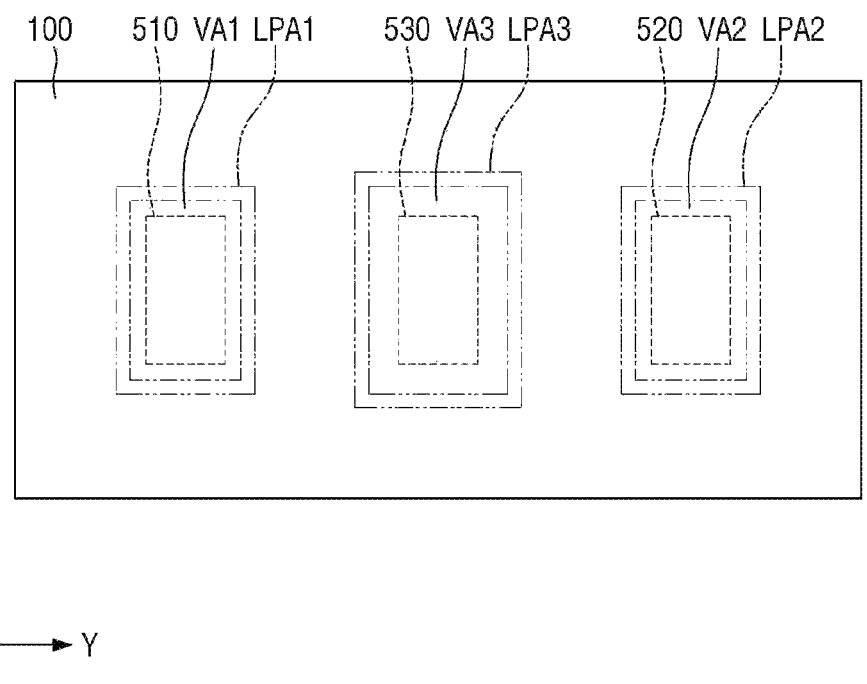
FIG. 16 is a plan view of a cover window and a plurality of sound generators according to an embodiment.

FIG. 16 is a plan view of a cover window 100 and a plurality of sound generators 510 through 530 according to an embodiment.

The embodiment of FIG. 16 is substantially the same as the embodiment of FIG. 14 except that the display device 10 additionally includes a third sound generator 530, and the cover window 100 includes a third lattice pattern area LPA3 surrounding the third sound generator 530. The same or like elements shown in FIG. 16 have been labeled with the same reference characters as used above to describe the embodiment shown in FIG. 14, and any repetitive detailed description thereof will hereinafter be omitted or simplified.

Referring to FIG. 16, the cover window 100 may further include the third lattice pattern area LPA3 in which another plurality of lattice patterns LP are disposed. The third lattice pattern area LPA3 may define a third vibration area VA3. The third vibration area VA3 may be an area surrounded by the third lattice pattern area LPA3. A first vibration area VA1 may be disposed adjacent to the upper side of the display panel 300, a second vibration area VA2 may be disposed adjacent to the lower side of the display panel 300, and the third vibration area VA3 may be disposed adjacent to the center of the display panel 300.

The third vibration area VA3 may overlap the third sound generator 530 in the third direction (Z-axis direction). The third sound generator 530 may not overlap the bottom panel cover 400 in the third direction (Z-axis direction). Therefore, the bottom panel cover 400 may not overlap the third vibration area VA3 in the third direction (Z-axis direction). If the third sound generator 530 is attached to the bottom panel cover 400, the vibration of the third sound generator 530 may be absorbed by the buffer member 420. Therefore, it may be difficult to vibrate the display panel 300 through the third sound generator 530.

The third sound generator 530 may be attached to a surface of the display panel 300 by an adhesive member. In one embodiment, for example, the third sound generator 530 may be attached to a surface of the substrate SUB by an adhesive member. In an embodiment, the adhesive member may include a light absorbing material such as a black pigment or dye to prevent the third sound generator 530 from being seen.

In such an embodiment, since the third lattice pattern area LPA3 includes the lattice patterns LP, the cover window 100 may have flexibility in the third lattice pattern area LPA3. In such an embodiment, a modulus of the third vibration area VA3 in the cover window 100 may be lower than a modulus of an area other than the vibration areas VA1 through VA3. The modulus is a modulus of elasticity representing the ratio of stress to strain, and the lower the modulus, the higher the elasticity. Therefore, in the cover window 100, the degree of vibration freedom of the third vibration area VA3 may be higher than the degree of vibration freedom of the area other than the vibration areas VA1 through VA3. Hence, when the vibration of the third sound generator 530 occurs in the third vibration area VA3, the third lattice pattern area LPA3 including the lattice patterns LP may reduce the vibration of the third sound generator 530 from being transmitted to the area other than the third vibration area VA3 in the cover window 100. Accordingly, the sound output by the third sound generator 530 from the side of the display device 10 instead of the front of the display device 10 may be substantially reduced.

In an embodiment, as shown in FIG. 16, the third lattice pattern area LPA3 is shaped in a rectangular frame-like shape (or a rectangular window frame-like shape) in a plan view, and the third vibration area VA3 is rectangular in a plan view. However, embodiments of the disclosure are not limited thereto. In one embodiment, for example, the third lattice pattern area LPA3 may be shaped in a polygonal frame-like shape, a circular frame-like shape, an elliptical frame-like shape or an irregular-shaped frame-like shape in a plan view, and the third vibration area VA3 may be polygonal, circular, elliptical or irregular-shaped in a plan view.

In an embodiment, the third sound generator 530 is quadrangular in a plan view as shown in FIG. 16. However, embodiments of the disclosure are not limited thereto. In one embodiment, for example, the third sound generator 530 may be polygonal, circular, elliptical, or irregular-shaped in a plan view.

The area of the third vibration area VA3 may be larger than the area of the first vibration area VA1 and larger than the area of the second vibration area VA2. A larger vibration area may be more advantageous in implementing a bass sound. Therefore, a first sound output when the first sound generator 510 vibrates the first vibration area VA1 and a second sound output when the second sound generator 520 vibrates the second vibration area VA2 may be sounds in a first frequency band, and a third sound output when the third sound generator 530 vibrates the third vibration area VA3 may be a sound in a second frequency band. The second frequency band may be lower than the first frequency band. In one embodiment, for example, the first frequency band may be a frequency band having a maximum sound pressure level (measured in dB) of about 800 Hz or higher, and the second frequency band may be a frequency band having a maximum sound pressure level lower than about 800 Hz. Therefore, since the display device 10 can output both a low-pitched sound and a high-pitched sound, it can provide a rich sound to a user. In such an embodiment, the first sound may be a first stereo sound, and the second sound may be a second stereo sound. Therefore, the display device 10 can output the first stereo sound, the second stereo sound, and a bass sound, that is, a 2.1-channel sound.

In such an embodiment, while the first sound generator 510 and the second sound generator 520 are the same type of vibration generator, the third sound generator 530 may be a vibration generator different from the first sound generator 510 and the second sound generator 520. In one embodiment, for example, each of the first sound generator 510 and the second sound generator 520 may be a piezoelectric element, a piezoelectric actuator or an exciter, which is desired in outputting a high-pitched sound, and the third sound generator 530 may be an exciter or a linear resonance actuator, which is desired in outputting a low-pitched sound.

Figure 17:
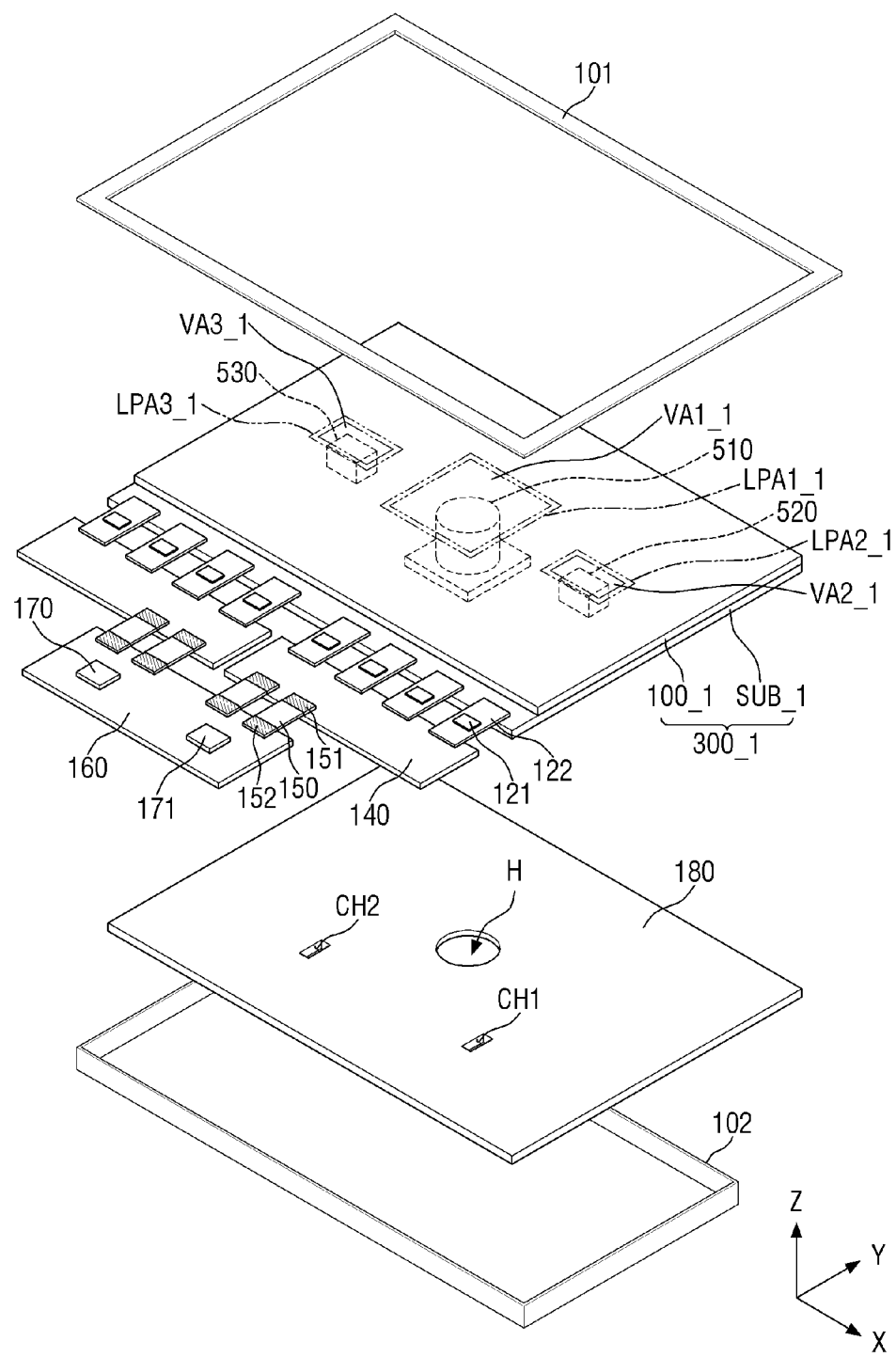
FIG. 17 is an exploded perspective view of a display device according to an embodiment.
Figure 18:
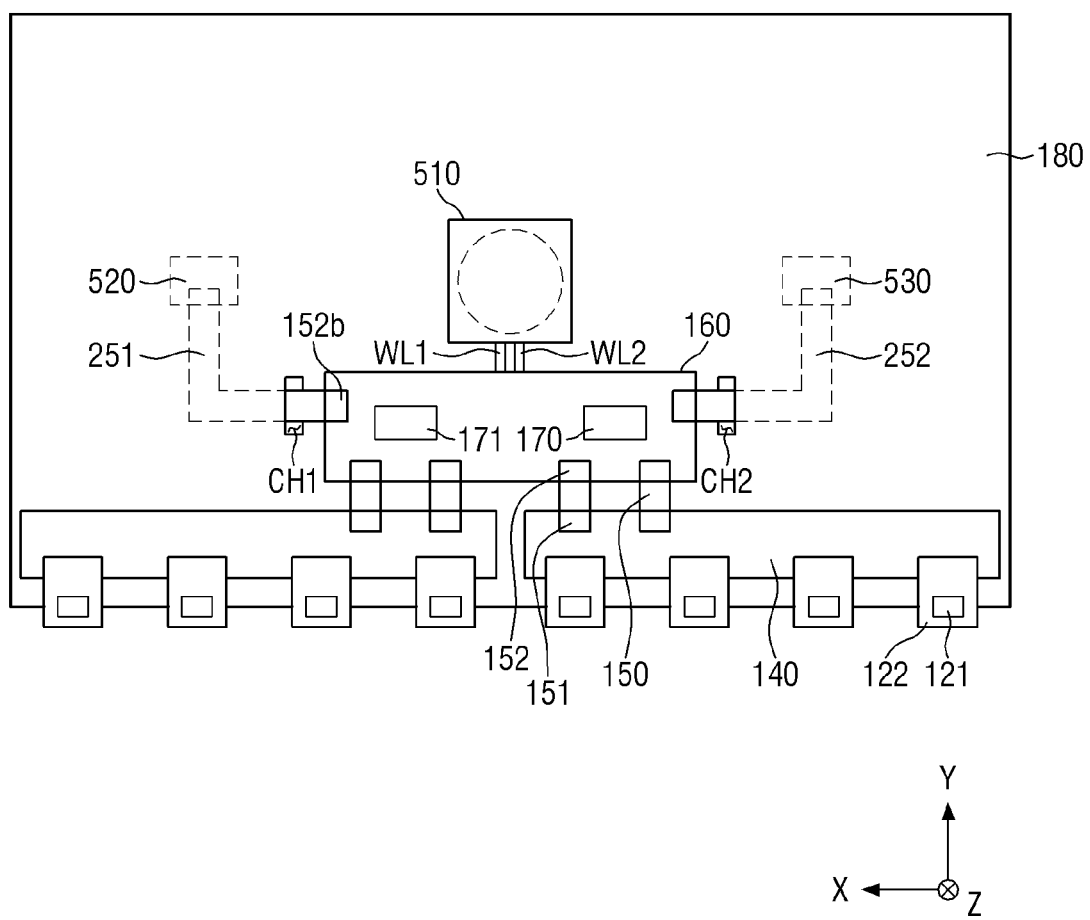
FIG. 18 is a bottom view of an embodiment of a display panel according to an embodiment.

FIG. 17 is an exploded perspective view of a display device 10_1 according to an embodiment. FIG. 18 is a bottom view of an embodiment of a display panel 300_1 according to an embodiment.

Referring to FIGS. 17 and 18, an embodiment of the display device 10_1 may be a large screen display device such as a monitor or a television. In such an embodiment, the display device 10_1 includes an upper set cover 101, a lower set cover 102, the display panel 300_1, source driving circuits 121, flexible films 122, a heat dissipation film 130, source circuit boards 140, first cables 150, a control circuit board 160, a timing control circuit 170, a bottom chassis 180, a first sound generator 510, a second sound generator 520, and a third sound generator 530.

The upper set cover 101 may cover edges of an upper surface of the display panel 300_1. The upper set cover 101 may cover a non-display area and expose a display area of the display panel 300_1. The lower set cover 102 may be disposed under the bottom chassis 180. In an embodiment, the source circuit boards 140, the first cables 150, and the control circuit board 160 are disposed under the display panel 300_1 by bending the flexible films 122, and the lower set cover 102 may cover the source circuit boards 140, the first cables 150, and the control circuit board 160.

The display panel 300_1 may include a substrate SUB_1 and a cover window 100_1. The cover window 100_1 may be placed to face a first surface of the substrate SUB_1. The substrate SUB_1 and the cover window 100_1 may be rigid or flexible. Each of the substrate SUB_1 and the cover window 100_1 may include or be made of glass or plastic.

A side of each of the flexible films 122 may be disposed on the first surface of the substrate SUB_1 of the display panel 300_1, and another side of each of the flexible films 122 may be attached on a surface of one of the source circuit boards 140. In an embodiment, the substrate SUB_1 is larger in size than the cover window 100_1, such that a side of the substrate SUB_1 may be exposed without being covered by the cover window 100_1. The flexible films 122 may be attached to the exposed side of the substrate SUB_1 which is not covered by the cover window 100_1. Each of the flexible films 122 may be attached on the first surface of the substrate SUB_1 and the surface of one of the source circuit boards 140 by using an anisotropic conductive film.

Each of the flexible films 122 may be a flexible film such as a tape carrier package or a chip on film. The flexible films 122 may be bent toward the bottom of the substrate SUB_1 as illustrated in FIG. 18. In such an embodiment, the source circuit boards 140, the first cables 150, and the control circuit board 160 may be disposed on a lower surface of the bottom chassis 180.

The source driving circuits 121 may be disposed on surfaces of the flexible films 122, respectively. The source driving circuits 121 may be formed as integrated circuits. Each of the source driving circuits 121 converts digital video data into analog data voltages based on a source control signal of the timing control circuit 170 and supplies the analog data voltages to data lines of the display panel 300_1 through a flexible film 122.

Each of the source circuit boards 140 may be connected to the control circuit board 160 by the first cables 150. Each of the source circuit boards 140 may include first connectors 151 for connection to the first cables 150. The source circuit boards 140 may be flexible printed circuit boards or printed circuit boards. The first cables 150 may be flexible cables.

The control circuit board 160 may be connected to the source circuit boards 140 by the first cables 150. In an embodiment, the control circuit board 160 may include second connectors 152 for connection to the first cables 150. The control circuit board 160 may be fixed on a surface of the bottom chassis 180 by fixing members such as screws. The control circuit board 160 may be a flexible printed circuit board or a printed circuit board.

The timing control circuit 170 may be disposed on a surface of the control circuit board 160. The timing control circuit 170 may be formed as an integrated circuit. The timing control circuit 170 may receive digital video data and timing signals from a system on chip of a system circuit board and generate a source control signal for controlling the timings of the source driving circuits 121 based on the timing signals.

A sound driving circuit 340 may be disposed on the surface of the control circuit board 160. The sound driving circuit 340 may be formed as an integrated circuit. The sound driving circuit 340 may receive sound data from the system circuit board. The sound driving circuit 340 may convert sound data, which is digital data, into a first sound signal, a second sound signal and a third sound signal which are analog signals. The sound driving circuit 340 may output the first sound signal to the first sound generator 510, the second sound signal to the second sound generator 520, and the third sound signal to the third sound generator 530.

The system on chip may be mounted on the system circuit board connected to the control circuit board 160 by a flexible cable and may be formed as an integrated circuit. The system on chip may be a processor of a smart television, a central processing unit ("CPU") or graphics card of a computer or notebook computer, or an application processor of a smartphone or tablet PC. The system circuit board may be a flexible printed circuit board or a printed circuit board.

A power supply circuit may be additionally provided on the surface of the control circuit board 160. The power supply circuit may generate voltages used for driving the display panel 300_1 from main power received from the system circuit board and supply the voltages to the display panel 300_1. In one embodiment, for example, the power supply circuit may generate a high-potential voltage, a low-potential voltage, and an initialization voltage for driving organic light emitting elements and supply the voltages to the display panel 300_1. In an embodiment, the power supply circuit may generate driving voltages for driving the source driving circuits 121, the timing control circuit 170, etc. and supply the generated voltages. The power supply circuit may be formed as an integrated circuit. Alternatively, the power supply circuit may be disposed on a power circuit board formed separately from the control circuit board 160. The power circuit board may be a flexible printed circuit board or a printed circuit board.

The first sound generator 510, the second sound generator 520, and the third sound generator 530 may be disposed on a second surface which is opposite the first surface of the substrate SUB_1. The first sound generator 510 may be a vibration device capable of vibrating the display panel 300_1 in the third direction (Z-axis direction) based on the first sound signal of the sound driving circuit 340. The second sound generator 520 may be a vibration device capable of vibrating the display panel 300_1 in the third direction (Z-axis direction) based on the second sound signal of the sound driving circuit 340. The third sound generator 530 may be a vibration device capable of vibrating the display panel 300_1 in the third direction (Z-axis direction) based on the third sound signal of the sound driving circuit 340.

The first sound generator 510 may be an exciter that vibrates the display panel 300_1 by generating a magnetic force using a voice coil as illustrated in FIG. 7. Each of the second sound generator 520 and the third sound generator 530 may be a piezoelectric element or a piezoelectric actuator that vibrates the display panel 300_1 using a piezoelectric material that contracts or expands based on an applied voltage as illustrated in FIG. 5.

The first sound generator 510 may serve as a low-frequency sound generator that outputs low-frequency sounds, and each of the second sound generator 520 and the third sound generator 530 may serve as a high-frequency sound generator that outputs high-frequency sounds. The third sound generator 530 may serve as a high-frequency sound generator that outputs high-frequency sounds. A low-frequency sound may refer to a sound in a low-frequency band of about 800 Hz or less, and a high-frequency sound may refer to a sound in a high-frequency band of higher than about 800 Hz. However, embodiments of the disclosure are not limited thereto. In an embodiment, when a low-frequency sound is a sound in a low-frequency band of about 800 Hz or less, the low-frequency sound may contain both low and mid sounds.

The bottom chassis 180 may be disposed on the second surface of the substrate SUB_1. A hole H, in which the first sound generator 510 is disposed, may be defined in an area of the bottom chassis 180 which corresponds to the first sound generator 510. In addition, a first cable hole CH1, through which a first sound circuit board 251 connecting the control circuit board 160 and the second sound generator 520 is disposed, and a second cable hole CH2, through which a second sound circuit board 252 connecting the control circuit board 160 and the third sound generator 530 is disposed, may be defined in the bottom chassis 180. The bottom chassis 180 may include metal or tempered glass.

The heat dissipation film 130 may be disposed on the second surface of the substrate SUB1. The first sound generator 510 may be disposed on a surface of the heat dissipation film 130. The heat dissipation film 130 dissipates heat generated by the first sound generator 510. In such an embodiment, the heat dissipation film 130 may include a metal layer having high thermal conductivity, such as graphite, silver (Ag), copper (Cu) or aluminum (Al).

In an embodiment, the heat dissipation film 130 may include a plurality of graphite layers or a plurality of metal layers formed in the first direction (X-axis direction) and the second direction (Y-direction). In this case, since the heat generated by the first sound generator 510 may be diffused in the first direction (X-axis direction) and the second direction (Y-axis direction), the heat may be released more effectively. Therefore, the heat dissipation film 130 may minimize the effect of the heat generated by the first sound generator 510 on the display panel 300_1. In an embodiment, a thickness D1 of the heat dissipation film 130 may be greater than a thickness D2 of the substrate SUB_1 and a thickness D3 of the cover window 100_1 such that the effect of the heat generated by the first sound generator 510 on the display panel 3001 may be further reduced.

Alternatively, the heat dissipation film 130 may be omitted. In such an embodiment, elements disposed on the surface of the heat dissipation film 130 may be disposed on the second surface of the substrate SUB_1.

The flexible films 122 may be bent toward the bottom of the bottom chassis 180 and may be attached to the source circuit boards 140 on the surface of the bottom chassis 180. The source circuit boards 140 and the control circuit board 160 may be disposed on the surface of the bottom chassis 180 and may be connected to each other by the first cables 150.

The first sound generator 510 may be disposed closer to the center of the display panel 300_1 than the second sound generator 520 and the third sound generator 530. The second sound generator 520 may be disposed close to a side of the display panel 300_1, for example, close to a right side of the display panel 300_1. The third sound generator 530 may be disposed close to the other side of the display panel 300_1, for example, close to a left side of the display panel 300_1.

Each of the second sound generator 520 and the third sound generator 530 may be attached on the surface of the dissipation film 130 by an adhesive member such as a pressure sensitive adhesive. The second sound generator 520 may be electrically connected to the control circuit board 160 by the first sound circuit board 251, and the third sound generator 530 may be electrically connected to the control circuit board 160 by the second sound circuit board 252. Each of the first sound circuit board 251 and the second sound circuit board 252 may be a flexible printed circuit board or a flexible cable.

A first pad and a second pad may be disposed on a side of each of the first sound circuit board 251 and the second sound circuit board 252. The first pad of the first sound circuit board 251 may be connected to a first electrode of the second sound generator 520, and the second pad of the first sound circuit board 251 may be connected to a second electrode of the second sound generator 520. The first pad of the second sound circuit board 252 may be connected to a first electrode of the third sound generator 530, and the second pad of the second sound circuit board 252 may be connected to a second electrode of the third sound generator 530.

A connection part for connection to a connector 152b of the control circuit board 160 may be disposed on the other side of each of the first sound circuit board 251 and the second sound circuit board 252. The second sound generator 520 may be connected to a connector 152b of the control circuit board 160 by the connection part of the first sound circuit board 251. The third sound generator 530 may be connected to another connector 152b of the control circuit board 160 by the connection part of the second sound circuit board 252.

The timing control circuit 170 and the sound driving circuit 340 may be disposed on the control circuit board 160. The sound driving circuit 340 may also be disposed on a circuit board other than the control circuit board 160. In one embodiment, for example, the sound driving circuit 340 may be disposed on the system circuit board, the power circuit board, or a sound circuit board. The sound circuit board refers to a circuit board on which only the sound driving circuit 340 is disposed without other integrated circuits.

The sound driving circuit 340 may include a digital signal processor ("DSP") for digitally processing sound signals, a digital-to-analog converter ("DAC") for converting digital signals output from the DSP into driving voltages which are analog signals, and an amplifier ("AMP") for amplifying the analog driving voltages output from the DAC and outputting the amplified analog driving voltages.

The sound driving circuit 340 may generate the first sound signal including first driving voltages for driving the first sound generator 510 based on stereo signals. The sound driving circuit 340 may generate the second sound signal including second driving voltages for driving the second sound generator 520 based on stereo signals. The sound driving circuit 340 may generate the third sound signal including third driving voltages for driving the third sound generator 530 based on stereo signals.

The first sound generator 510 may receive the first sound signal including the first driving voltages from the sound driving circuit 340. The first sound generator 510 may output sound by vibrating the display panel 300_1 based on the first driving voltages. When a lower plate 215 of the first sound generator 510 is disposed on the bottom chassis 180, both ends of a voice coil 213 of the first sound generator 510 may be connected to a first sound wiring WL1 and a second sound wiring WL2. The first sound wiring WL1 and the second sound wiring WL2 may be electrically connected to metal lines of the control circuit board 160.

The second sound generator 520 may receive the second sound signal including the second driving voltages from the sound driving circuit 340. The second sound generator 520 may output sound by vibrating the display panel 3001 based on the second driving voltages. The second sound signal of the sound driving circuit 340 may be transmitted to the second sound generator 520 through the first sound circuit board 251.

The third sound generator 530 may receive the third sound signal including the third driving voltages from the sound driving circuit 340. The third sound generator 530 may output sound by vibrating the display panel 300_1 based on the third driving voltages. The third sound signal of the sound driving circuit 340 may be transmitted to the third sound generator 530 through the second sound circuit board 252.

The second sound generator 520 and the third sound generator 530 may be disposed on the surface of the heat dissipation film 130. In such an embodiment, the first sound circuit board 251 connected to the second sound generator 520 may be connected to a connector 152b of the control circuit board 160 through the first cable hole CH1 defined through the bottom chassis 180. In such an embodiment, the second sound circuit board 252 connected to the third sound generator 530 may be connected to another connector 152b of the control circuit board 160 through the second cable hole CH2 defined through the bottom chassis 180. The first cable hole CH1 may be disposed between a side of the control circuit board 160 and the second sound generator 520 when seen in a plan view. The second cable hole CH2 may be disposed between the other side of the control circuit board 160 and the third sound generator 530 when seen in a plan view.

In an embodiment, a vibration damping member 400 may be disposed on a surface of the display panel 300_1, and the first sound generator 510 may be disposed on the vibration damping member 400 such that the vibration displacement of the display panel 3001 generated by the first sound generator 510 may be reduced. The vibration damping member 400 may be attached on the heat dissipation film 130 disposed on the second surface of the substrate SUB_1. The first sound generator 510 may be disposed at the center of the vibration damping member 400. The vibration damping member 400 may not overlap the second sound generator 520 and the third sound generator 530 in the thickness direction of the display panel 300_1.

The cover window 100_1 may include a first lattice pattern area LPA1_1, a second lattice pattern area LPA2_1, and a third lattice pattern area LPA3_1. The first lattice pattern area LPA1_1 may be disposed adjacent to the center of the display panel 300_1, the second lattice pattern area LPA2_1 may be disposed adjacent to the right side of the display panel 300_1, and the third lattice pattern area LPA3_1 may be disposed adjacent to the left side of the display panel 300_1.

The first lattice pattern area LPA1_1 may be an area in which a plurality of lattice patterns LP are disposed and may define a first vibration area VA1_1. The first vibration area VA1_1 may be an area surrounded by the first lattice pattern area LPA1_1. The first vibration area VA1_1 may overlap the first sound generator 510 in the third direction (Z-axis direction).

The first lattice pattern area LPA1_1 may be an area in which a plurality of lattice patterns LP are disposed and may have flexibility due to the lattice patterns LP. The first lattice pattern area LPA1_1 may define the first vibration area VA1_1. The first vibration area VA1_1 may be an area surrounded by the first lattice pattern area LPA1_1. The first vibration area VA1_1 may overlap the first sound generator 510 in the third direction (Z-axis direction).

The second lattice pattern area LPA2_1 may be an area in which another plurality of lattice patterns LP are disposed and may have flexibility due to the lattice patterns LP. The second lattice pattern area LPA2_1 may define a second vibration area VA2_1. The second vibration area VA2_1 may be an area surrounded by the second lattice pattern area LPA2_1. The second vibration area VA2_1 may overlap the second sound generator 520 in the third direction (Z-axis direction).

The third lattice pattern area LPA3_1 may be an area in which another plurality of lattice patterns LP are disposed and may have flexibility due to the lattice patterns LP. The third lattice pattern area LPA3_1 may define a third vibration area VA3_1. The third vibration area VA3_1 may be an area surrounded by the third lattice pattern area LPA3_1. The third vibration area VA3_1 may overlap the third sound generator 530 in the third direction (Z-axis direction).

The first vibration area VA1_1 may overlap the first sound generator 510 in the third direction (Z-axis direction), the second vibration area VA2_1 may overlap the second sound generator 520 in the third direction (Z-axis direction), and the third vibration area VA3_1 may overlap the third sound generator 530 in the third direction (Z-axis direction). Therefore, the first lattice pattern area LPA1_1 may reduce the transmission of the vibration of the first sound generator 510 to an area other than the first vibration area VA1_1 in the cover window 100_1. In such an embodiment, the second lattice pattern area LPA2_1 may reduce the transmission of the vibration of the second sound generator 520 to an area other than the second vibration area VA2_1 in the cover window 100_1. In such an embodiment, the third lattice pattern area LPA3_1 may reduce the transmission of the vibration of the third sound generator 530 to an area other than the third vibration area VA3_1 in the cover window 100_1. Accordingly, the sound output by the first sound generator 510, the sound output by the second sound generator 520, and the sound output by the third sound generator 530 from the side of the display device 10_1 instead of the front of the display device 10_1 may be substantially reduced.

The area of the first vibration area VA1_1 may be larger than the area of the second vibration area VA2_1 and larger than the area of the third vibration area VA3_1. A larger vibration area may be more desired in implementing a bass sound. Therefore, a first sound output when the first sound generator 510 vibrates the first vibration area VA1_1 may be a sound in a first frequency band, and a second sound output when the second sound generator 520 vibrates the second vibration area VA2_1 and a third sound output when the third sound generator 530 vibrates the third vibration area VA3_1 may be sounds in a second frequency band. The second frequency band may be higher than the first frequency band. In one embodiment, for example, the first frequency band may be a frequency band having a maximum sound pressure level (measured in dB) lower than about 800 Hz, and the second frequency band may be a frequency band having a maximum sound pressure level higher than about 800 Hz. Therefore, since the display device 10_1 may output both a low-pitched sound and a high-pitched sound, the display device 10_1 may provide a rich sound to a user. In such an embodiment, the second sound may be a first stereo sound, and the third sound may be a second stereo sound. Therefore, the display device 10_1 may output the first stereo sound, the second stereo sound, and a bass sound, that is, a 2.1-channel sound.

Figure 19:
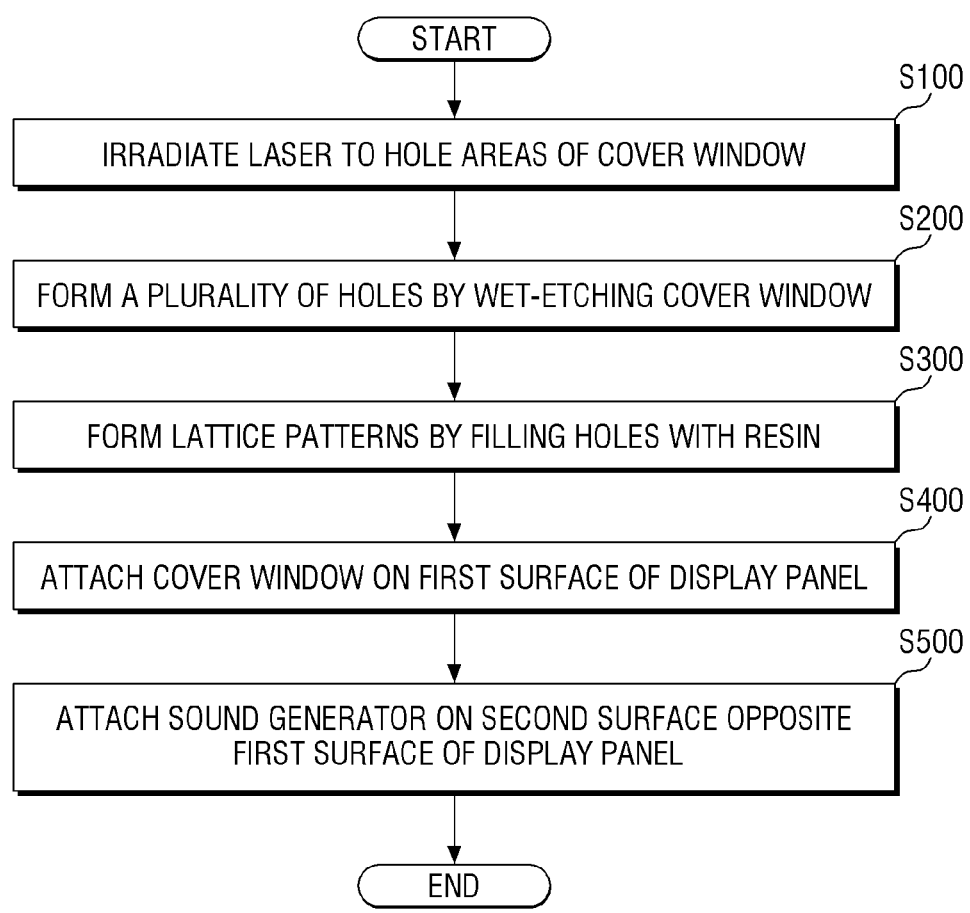
FIG. 19 is a flowchart illustrating a method of fabricating a display panel according to an embodiment.

FIG. 19 is a flowchart illustrating a method of fabricating a display panel according to an embodiment. FIGS. 20 through 24 are views for explaining the method of fabricating the display panel of FIG. 19.

An embodiment of the method of fabricating the display panel will now be described in detail with reference to FIGS. 19 through 24.

Figure 20:
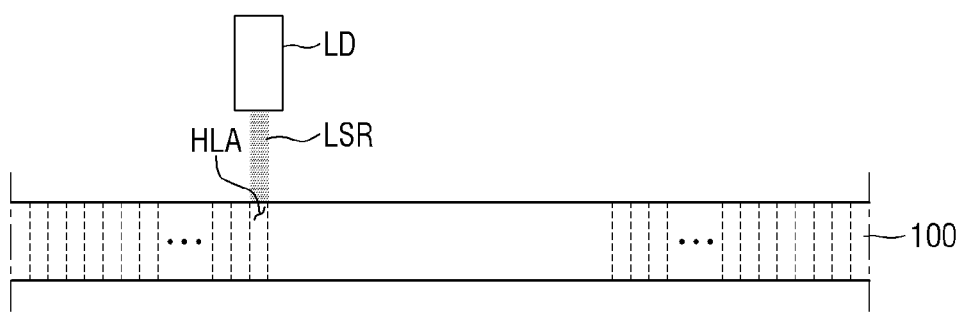
FIGS. 20 through 24 are views illustrating the method of fabricating the display panel of FIG. 19.

First, referring to FIG. 20, a laser LSR is radiated to hole areas HLA of a cover window 100 using a laser device LD (operation S100 in FIG. 19).

The hole areas HLA refer to areas for forming a plurality of lattice patterns LP of a first lattice pattern area LPA1.

Figure 21:
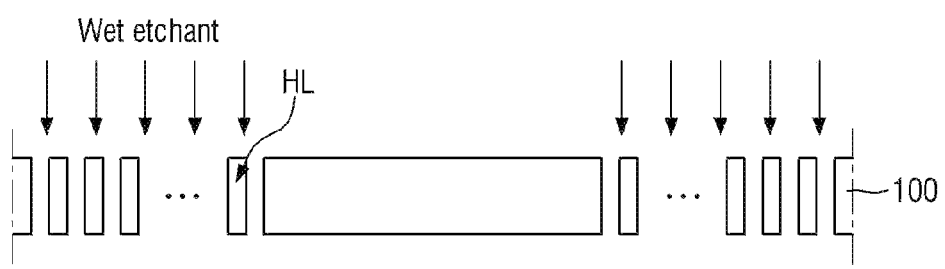

Second, referring to FIG. 21, a plurality of holes HL are formed in the cover window 100 using a wet etchant (operation S200 in FIG. 19).

Since the hole areas HLA in which the holes HL are to be formed have already been irradiated with the laser LSR, when the hole areas HLA are exposed to a wet etchant for etching the cover window 100, the holes HL may be effectively formed in the hole areas HLA irradiated with the laser LSR.

Figure 22:
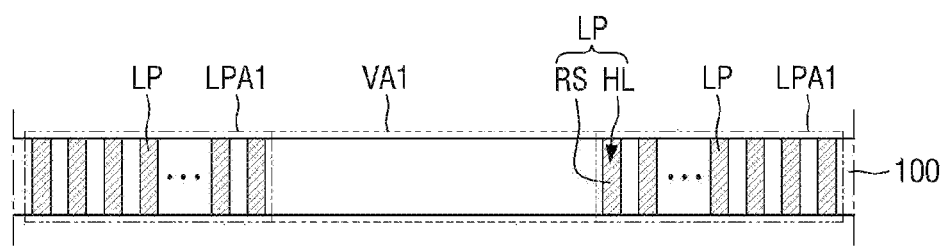

Third, referring to FIG. 22, the holes HL of the cover window 100 are filled with a resin RS to form the lattice patterns LP (operation S300 in FIG. 19).

When the resin RS is applied to the cover window 100, the resin RS may fill the holes HL. The resin RS may be a polymer. In an embodiment, a difference between a refractive index of the cover window 100 and a refractive index of the resin RS may be about 0.1 or less to minimize the refraction of light at a boundary between the cover window 100 and the resin RS. In an embodiment, the refractive index of the cover window 100 and the refractive index of the resin RS may be substantially equal to each other to prevent the refraction of light at the boundary between the cover window 100 and the resin RS.

Figure 23:
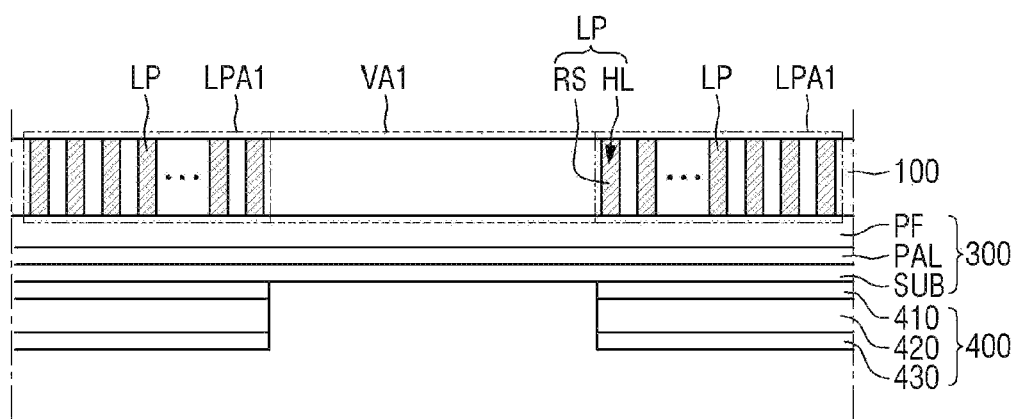

Fourth, referring to FIG. 23, the cover window 100 is provided or attached on a first surface of a display panel 300 (operation S400 in FIG. 19).

The first surface of the display panel 300 may be an upper surface of the display panel 300. The upper surface of the display panel 300 may be an upper surface of a polarizing film PF. A transparent adhesive member may be disposed between the cover window 100 and the polarizing film PF.

In such an embodiment, after the cover window 100 is provided or attached on the first surface of the display panel 300, a bottom panel cover 400 may be provided or attached on a second surface of the display panel 300. Here, the bottom panel cover 400 may not overlap a first vibration area VA1 defined by the first lattice pattern area LPA1 in the third direction (Z-axis direction).

Figure 24:
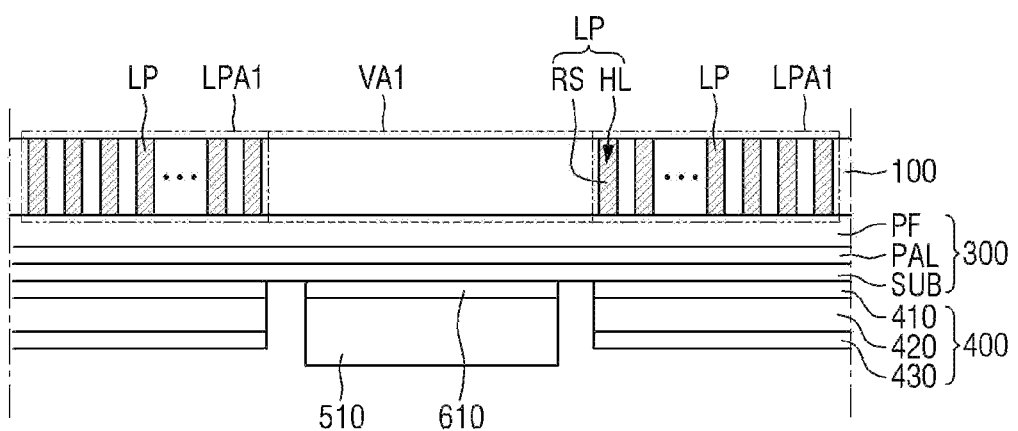

Fifth, referring to FIG. 24, a first sound generator 510 is provided or attached on the second surface of the display panel 300 (operation S500 in FIG. 19).

The first sound generator 510 may be attached to a surface of a substrate SUB of the display panel 300 by a first adhesive member 610. In one embodiment, for example, the first sound generator 510 may be attached to the surface of the substrate SUB by the first adhesive member 610. In such an embodiment, the first adhesive member 610 may include a light absorbing material such as a black pigment or dye to prevent the first sound generator 510 from being seen.

The first sound generator 510 may not overlap the bottom panel cover 400 in the third direction (Z-axis direction). The first sound generator 510 may overlap the first vibration area VA1 in the third direction (Z-axis direction).

In embodiments of the invention, as described above, when the vibration of the first sound generator 510 occurs in the first vibration area VA1, the first lattice pattern area LPA1 including the lattice patterns LP may reduce transmissions of the vibration of the first sound generator 510 to an area other than the first vibration area VA1 in the cover window 100. Accordingly, the sound output by the first sound generator 510 output to the side of a display device 10 instead of the front of the display device 10 may be substantially reduced.

In embodiments of a display device according to the invention, lattice patterns are provided in a cover window to surround a sound generator when seen in a plan view. Therefore, transmission of the vibration of the sound generator to an area other than a vibration area defined by the lattice patterns in the cover window may be substantially reduced, thereby reducing sound from being output to the side of a display panel.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel which displays an image;
a cover window which is disposed on a first surface of the display panel; and
a first sound generator which is disposed on a second surface opposite the first surface of the display panel and outputs sound by vibrating the display panel,
wherein the cover window comprises a first lattice pattern area including lattice patterns surrounding the first sound generator in a plan view.

2. The display device of claim 1, wherein each of the lattice patterns is defined by a hole defined through the cover window and a resin which fills the hole.

3. The display device of claim 2, wherein a difference between a refractive index of the cover window and a refractive index of the resin is about 0.1 or less.

4. The display device of claim 1, wherein a first side area of the first lattice pattern area and a second side area of the first lattice pattern area are connected to each other.

5. The display device of claim 1, wherein the lattice patterns comprise:
first lattice patterns which are arranged in a first direction and extend in the first direction;
second lattice patterns which are arranged in the first direction and extend in the first direction; and
third lattice patterns which are arranged in the first direction and extend in the first direction,
wherein one second lattice pattern among the second lattice patterns is disposed between one first lattice pattern among the first lattice patterns and one third lattice pattern among the third lattice patterns in a second direction orthogonal to the first direction.

6. The display device of claim 5, wherein
a gap between the first lattice patterns adjacent to each other in the first direction is defined as a first gap,
a gap between the second lattice patterns adjacent to each other in the first direction is defined as a second gap,
a gap between the third lattice patterns adjacent to each other in the first direction is defined as a third gap, and
the second gap is disposed between one first lattice pattern and one third lattice pattern, which are adjacent to each other in the second direction.

7. The display device of claim 6, wherein the second lattice pattern is disposed between the first gap and the third gap in the second direction.

8. The display device of claim 6, wherein the second lattice pattern is disposed between a gap between adjacent first lattice patterns and a gap between adjacent third lattice patterns in the second direction.

9. The display device of claim 6, wherein the lattice patterns further comprise fourth lattice patterns which are arranged in the first direction and extend in the first direction, and the third lattice pattern is disposed between the second lattice pattern and one fourth lattice pattern among the fourth lattice patterns in the second direction.

10. The display device of claim 9, wherein
a gap between the fourth lattice patterns adjacent to each other in the first direction is defined as a fourth gap, and
the third lattice pattern is disposed between the second gap and the fourth gap in the second direction.

11. The display device of claim 9, wherein the third gap is disposed between the second lattice pattern and the fourth lattice pattern.

12. The display device of claim 6, wherein
the lattice patterns further comprise a first lattice auxiliary pattern disposed in the first gap, and
an area of the first lattice pattern is larger than an area of the first lattice auxiliary pattern.

13. The display device of claim 1, further comprising:
a second sound generator which is disposed on the second surface of the display panel and outputs sound by vibrating the display panel,
wherein the cover window comprises a second lattice pattern area surrounding the second sound generator in the plan view.

14. The display device of claim 13, wherein an area of a first vibration area defined by the first lattice pattern area is the same as an area of a second vibration area defined by the second lattice pattern area.

15. The display device of claim 14, wherein
the first sound generator outputs a first stereo sound by vibrating the display panel, and
the second sound generator outputs a second stereo sound by vibrating the display panel.

16. The display device of claim 13, wherein an area of a first vibration area defined by the first lattice pattern area is smaller than an area of a second vibration area defined by the second lattice pattern area.

17. The display device of claim 16, wherein
the first sound generator outputs a sound in a first frequency band by vibrating the display panel, and
the second sound generator outputs a sound in a second frequency band by vibrating the display panel.

* * * * *